(12) United States Patent
Takahashi

(10) Patent No.: US 10,644,222 B2
(45) Date of Patent: May 5, 2020

(54) PIEZOELECTRIC DRIVE APPARATUS FOR MOTOR AND METHOD FOR MANUFACTURING THE SAME, MOTOR, ROBOT, AND PUMP

(71) Applicant: Seiko Epson Corporation, Tokyo (JP)

(72) Inventor: Tomoaki Takahashi, Matsumoto (JP)

(73) Assignee: Seiko Epson Corporation (JP)

( * ) Notice: Subject to any disclaimer, the term of this patent is extended or adjusted under 35 U.S.C. 154(b) by 581 days.

(21) Appl. No.: 15/367,524

(22) Filed: Dec. 2, 2016

(65) Prior Publication Data

US 2017/0162780 A1 Jun. 8, 2017

(30) Foreign Application Priority Data

Dec. 3, 2015 (JP) .................. 2015-236648

(51) Int. Cl.
*H01L 41/09* (2006.01)
*H02N 2/00* (2006.01)
(Continued)

(52) U.S. Cl.
CPC ............ *H01L 41/09* (2013.01); *B25J 9/12* (2013.01); *F04B 23/02* (2013.01); *F04B 43/08* (2013.01); *F04B 43/082* (2013.01); *F04B 43/095* (2013.01); *H01L 41/047* (2013.01); *H01L 41/22* (2013.01); *H01L 41/25* (2013.01); *H01L 41/29* (2013.01); *H02N 2/004* (2013.01); *H02N 2/0075* (2013.01); *H02N 2/103* (2013.01); *H02N 2/108* (2013.01)

(58) Field of Classification Search
CPC ....... H01L 41/047; H01L 41/09; H02N 2/004; H02N 2/0075; H02N 2/103; H02N 2/108

USPC ......................... 310/323.01–323.21
See application file for complete search history.

(56) References Cited

U.S. PATENT DOCUMENTS

2004/0095046 A1 5/2004 Ouchi et al.
2004/0256956 A1 12/2004 Miyazawa
(Continued)

FOREIGN PATENT DOCUMENTS

JP S62-299093 A 12/1987
JP 02-164284 A 6/1990
(Continued)

OTHER PUBLICATIONS

Machine translation of JP2010-007615 (Year: 2010).*

*Primary Examiner* — Derek J Rosenau
(74) *Attorney, Agent, or Firm* — Harness, Dickey & Pierce, P.L.C.

(57) ABSTRACT

A piezoelectric drive apparatus for a motor, the apparatus including a substrate having a longitudinal direction and a widthwise direction perpendicular to the longitudinal direction, a piezoelectric element provided on the substrate and having a first electrode, a second electrode, and a piezoelectric body positioned between the first electrode and the second electrode, and a contact section that is attached to a front end section of the substrate in the longitudinal direction thereof or in contact with the front end section of the substrate in the longitudinal direction thereof and comes into contact with a driven body, wherein the longitudinal direction of the substrate roughly coincides with a direction in which Young's modulus is minimized in a plane of the substrate.

9 Claims, 16 Drawing Sheets

(51) Int. Cl.
*H02N 2/10* (2006.01)
*F04B 23/02* (2006.01)
*H01L 41/22* (2013.01)
*F04B 43/08* (2006.01)
*B25J 9/12* (2006.01)
*F04B 43/09* (2006.01)
*H01L 41/047* (2006.01)
*H01L 41/25* (2013.01)
*H01L 41/29* (2013.01)

(56) References Cited

U.S. PATENT DOCUMENTS

2005/0184621 A1* 8/2005 Kitahara .............. G04C 13/12 310/311
2012/0248805 A1 10/2012 Kamijo et al.
2015/0114164 A1* 4/2015 Urano .................... H02N 2/004 74/490.03
2016/0001556 A1* 1/2016 Masuda .............. B41J 2/14201 347/71

FOREIGN PATENT DOCUMENTS

| | | |
|---|---|---|
| JP | 06-167664 A | 6/1994 |
| JP | 10-173476 A | 6/1998 |
| JP | 11-227198 A | 8/1999 |
| JP | 2002-067307 A | 3/2002 |
| JP | 2003-227719 A | 8/2003 |
| JP | 2004-320979 A | 11/2004 |
| JP | 2006-353030 A | 12/2006 |
| JP | 2008-227123 A | 9/2008 |
| JP | 2010007615 * 1/2010 ................ F04C 5/00 |
| JP | 2012-210052 A | 10/2012 |
| JP | 2014-192797 A | 10/2014 |

* cited by examiner

|  | PLANE ORIENTATION | LONGITUDINAL DIRECTION | WIDTHWISE DIRECTION | Ex [GPa] | Ey [GPa] | Gxy [GPa] | Ey/Ex/Gxy |
|---|---|---|---|---|---|---|---|
| M1 | (110) | ⟨111⟩ | ⟨112⟩ | 188.4 | 169.7 | 76.0 | 0.01 |
| M2 | (110) | ⟨112⟩ | ⟨111⟩ | 169.7 | 188.4 | 76.0 | 0.015 |
| M3 | (110) | ⟨100⟩ | ⟨110⟩ | 130.8 | 169.7 | 56.1 | 0.023 |
| M4 | (110) | ⟨110⟩ | ⟨001⟩ | 169.7 | 130.8 | 56.1 | 0.014 |
| M5 | (001) | ⟨100⟩ | ⟨010⟩ | 130.8 | 130.8 | 51.1 | 0.020 |
| M6 | (001) | ⟨110⟩ | ⟨110⟩ | 169.7 | 169.7 | 79.6 | 0.013 |
| M7 | (111) | ⟨110⟩ | ⟨112⟩ | 169.7 | 169.7 | 67.1 | 0.015 |

|  | $\nu_{xy}$ | F [kHz] | W [mm] | VERTICAL DISPLACEMENT RATIO | BENDING DISPLACEMENT RATIO | RATIO OF VERTICAL DISPLACEMENT MULTIPLIED BY BENDING DISPLACEMENT |
|---|---|---|---|---|---|---|
| M1 | 0.184 | 1204 | 1.003 | 100% | 100% | 100% |
| M2 | 0.166 | 1159 | 0.926 | 111% | 121% | 135% |
| M3 | 0.280 | 1010 | 0.772 | 131% | 176% | 230% |
| M4 | 0.364 | 1151 | 0.795 | 90% | 106% | 95% |
| M5 | 0.280 | 1012 | 0.718 | 127% | 185% | 235% |
| M6 | 0.066 | 1142 | 1.027 | 126% | 125% | 157% |
| M7 | 0.265 | 1148 | 0.848 | 103% | 119% | 122% |

F I G. 1 1

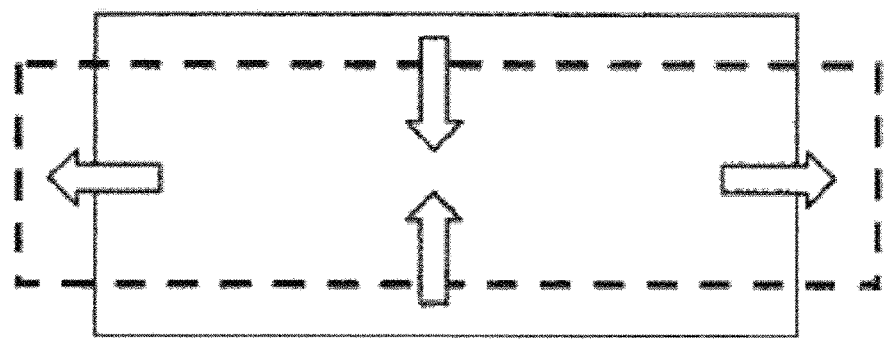
FIG.17
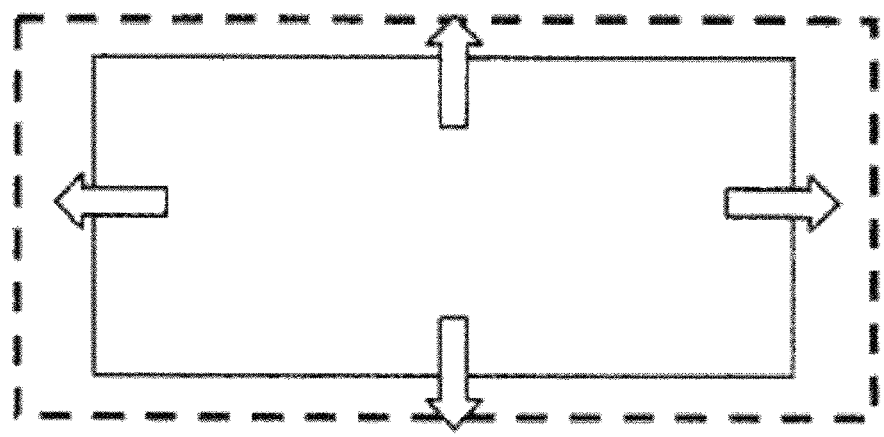
FIG.18
| c11 | 167.4 [GPa] |
|---|---|
| c12 | 65.23 [GPa] |
| c44 | 79.57 [GPa] |
| s11 | 0.007644 [GPa$^{-1}$] |
| s12 | −0.002143 [GPa$^{-1}$] |
| s44 | 0.012568 [GPa$^{-1}$] |
| sc | 0.003504 [GPa$^{-1}$] |
FIG.19

PIEZOELECTRIC DRIVE APPARATUS FOR MOTOR AND METHOD FOR MANUFACTURING THE SAME, MOTOR, ROBOT, AND PUMP

BACKGROUND

1. Technical Field

The present invention relates to a piezoelectric drive apparatus for a motor and a method for manufacturing the same, a motor, a robot, and a pump.

2. Related Art

A piezoelectric actuator (piezoelectric drive apparatus for motor) that uses a piezoelectric element to cause a vibrating body to vibrate to drive a driven body requires no magnet or coil and is therefore used in a variety of fields (see JP-A-2004-320979, for example). A piezoelectric drive apparatus of this type typically uses a piezoelectric element having a bulk-shaped piezoelectric body (bulk piezoelectric element) (see JP-A-2008-227123, for example).

On the other hand, as the piezoelectric element, there is a known piezoelectric element having a thin-film-shaped piezoelectric body (thin-film piezoelectric element). The thin-film piezoelectric element is primarily used in the head of an inkjet printer to eject ink.

Use of a thin-film piezoelectric element, such as that described above, in a piezoelectric drive apparatus allows reduction in the size of the piezoelectric drive apparatus and the size of an instrument driven by the piezoelectric drive apparatus. A piezoelectric drive apparatus using a thin-film piezoelectric element achieves compactness but has a resulting problem of insufficient output in some cases.

SUMMARY

An advantage of some aspects of the invention is to provide a piezoelectric drive apparatus for a motor capable of providing high output. Another advantage of some aspects of the invention is to provide a method for manufacturing the piezoelectric drive apparatus for a motor capable of providing high output. Still another advantage of some aspects of the invention is to provide a motor, a robot, and a pump including the piezoelectric drive apparatus for a motor.

The advantage can be achieved in the following aspects or application examples.

Application Example 1

A piezoelectric drive apparatus for a motor according to an aspect of the invention includes a substrate having a longitudinal direction and a widthwise direction perpendicular to the longitudinal direction, a piezoelectric element provided on the substrate and having a first electrode, a second electrode, and a piezoelectric body positioned between the first electrode and the second electrode, and a contact section that is attached to a front end section of the substrate in the longitudinal direction thereof or in contact with the front end section of the substrate in the longitudinal direction thereof and comes into contact with a driven body, and the longitudinal direction of the substrate roughly coincides with a direction in which Young's modulus is minimized in a plane of the substrate.

In the piezoelectric drive apparatus for a motor described above, for example, when voltage is applied to the piezoelectric element, large displacement (amplitude) of bending vibration of the substrate is achieved, whereby high output is provided (see "3. Experiment," which will be described later).

Application Example 2

A piezoelectric drive apparatus for a motor according to another aspect of the invention includes a substrate having a longitudinal direction and a widthwise direction perpendicular to the longitudinal direction, a piezoelectric element provided on the substrate and having a first electrode, a second electrode, and a piezoelectric body positioned between the first electrode and the second electrode, and a contact section that is attached to a front end section of the substrate in the longitudinal direction thereof or in contact with the front end section of the substrate in the longitudinal direction thereof and comes into contact with a driven body, and the longitudinal direction of the substrate roughly coincides with a direction in which a value of $Ey/Ex/Gxy$ is maximized in a plane of the substrate, where $Gxy$ represents a shear elastic coefficient of the substrate in the widthwise direction thereof, $Ex$ represents Young's modulus of the substrate in the longitudinal direction thereof, and $Ey$ represents Young's modulus of the substrate in the widthwise direction thereof.

In the piezoelectric drive apparatus for a motor described above, for example, when voltage is applied to the piezoelectric element, large displacement of bending vibration of the substrate is achieved, whereby high output is provided (see "3. Experiment," which will be described later).

Application Example 3

In Application Example 1 or 2, the substrate may be a silicon single crystal substrate.

The piezoelectric drive apparatus for a motor described above can provide high output.

Application Example 4

In Application Example 3, the substrate may be a {110} substrate, and the longitudinal direction of the substrate may roughly coincide with a <100> direction.

The piezoelectric drive apparatus for a motor described above can provide high output.

Application Example 5

In Application Example 3, the substrate may be a {100} substrate, and the longitudinal direction of the substrate may roughly coincide with a <100> direction.

The piezoelectric drive apparatus for a motor described above can provide high output.

Application Example 6

In any one of Application Examples 1 to 5, the substrate and the piezoelectric element may form a chip, the chip may be formed of a plurality of chips, and the plurality of chips may be arranged in a thickness direction of the substrate.

The piezoelectric drive apparatus for a motor described above can provide higher output.

Application Example 7

A method for manufacturing a piezoelectric drive apparatus for a motor according to another aspect of the invention includes forming a plurality of piezoelectric elements on a wafer, the plurality of piezoelectric elements each having a first electrode, a second electrode, and a piezoelectric body positioned between the first electrode and the second electrode, forming a plurality of chip regions on the wafer in correspondence with the plurality of piezoelectric elements, the plurality of chip regions each having a longitudinal direction and a widthwise direction perpendicular to the longitudinal direction, extracting the chip regions from the wafer to acquire chips, and attaching a contact section that comes into contact with a driven body to a front end section of each of the chips in the longitudinal direction thereof or placing the contact section that comes into contact with the driven body in such away that the contact section is in contact with the front end section of each of the chips in the longitudinal direction thereof, and the chip regions are so formed that the longitudinal direction of the chip regions roughly coincides with a direction in which Young's modulus is minimized in a plane of the chip regions.

In the method for manufacturing a piezoelectric drive apparatus for a motor described above, a piezoelectric drive apparatus for a motor capable of providing high output can be manufactured.

Application Example 8

A method for manufacturing a piezoelectric drive apparatus for a motor according to another aspect of the invention includes forming a plurality of piezoelectric elements on a wafer, the plurality of piezoelectric elements each having a first electrode, a second electrode, and a piezoelectric body positioned between the first electrode and the second electrode, forming a plurality of chip regions on the wafer in correspondence with the plurality of piezoelectric elements, the plurality of chip regions each having a longitudinal direction and a widthwise direction perpendicular to the longitudinal direction, extracting the chip regions from the wafer to acquire chips; and attaching a contact section that comes into contact with a driven body to a front end section of each of the chips in the longitudinal direction thereof or placing the contact section that comes into contact with the driven body in such away that the contact section is in contact with the front end section of each of the chips in the longitudinal direction thereof, and the chip regions are so formed that the longitudinal direction of the chip regions roughly coincides with a direction in which a value of Ey/Ex/Gxy is maximized in a plane of the chip regions, where Gxy represents a shear elastic coefficient of the chip regions in the widthwise direction thereof, Ex represents Young's modulus of the chip regions in the longitudinal direction thereof, and Ey represents Young's modulus of the chip regions in the widthwise direction thereof.

In the method for manufacturing a piezoelectric drive apparatus for a motor described above, a piezoelectric drive apparatus for a motor capable of providing high output can be manufactured.

Application Example 9

In Application Example 7 or 8, the wafer may be a silicon single crystal wafer.

In the method for manufacturing a piezoelectric drive apparatus for a motor described above, a piezoelectric drive apparatus for a motor capable of providing high output can be manufactured.

Application Example 10

In Application Example 9, the wafer may be a {110} wafer, and the chip regions may be so formed that the longitudinal direction thereof roughly coincides with a <100> direction.

In the method for manufacturing a piezoelectric drive apparatus for a motor described above, a piezoelectric drive apparatus for a motor capable of providing high output can be manufactured.

Application Example 11

In Application Example 9, the wafer may be a {100} wafer, and the chip regions may be so formed that the longitudinal direction thereof roughly coincides with a <100> direction.

In the method for manufacturing a piezoelectric drive apparatus for a motor described above, a piezoelectric drive apparatus for a motor capable of providing high output can be manufactured.

Application Example 12

Any one of Application Examples 7 to 11 may further include arranging the plurality of chips in a thickness direction of the chip regions.

In the method for manufacturing a piezoelectric drive apparatus for a motor described above, a piezoelectric drive apparatus for a motor capable of providing higher output can be manufactured.

Application Example 13

A motor according to another aspect of the invention includes the piezoelectric drive apparatus for a motor described in any one of Application Examples 1 to 6, and a rotor rotated by the piezoelectric drive apparatus for a motor.

The motor described above can include the piezoelectric drive apparatus for a motor according to the aspect of the invention.

Application Example 14

A robot according to another aspect of the invention includes a plurality of links, joints that connect the plurality of links to each other, and the piezoelectric drive apparatus for a motor described in any one of Application Examples 1 to 6 and causing the plurality of links to pivot at the joints.

The robot described above can include the piezoelectric drive apparatus for a motor according to the aspect of the invention.

Application Example 15

A pump according to another aspect of the invention includes the piezoelectric drive apparatus for a motor described in any one of Application Examples 1 to 6, a tube through which liquid is transported, and a plurality of fingers that block the tube when the piezoelectric drive apparatus for a motor is driven.

The pump described above can include the piezoelectric drive apparatus for a motor according to the aspect of the invention.

BRIEF DESCRIPTION OF THE DRAWINGS

The invention will be described with reference to the accompanying drawings, wherein like numbers reference like elements.

FIG. 11 is a table showing crystal orientation and parameters.

FIG. 17 describes the vibration mode of a substrate.

FIG. 18 describes the deformation mode of a piezoelectric element.

FIG. 19 is a table showing silicon fundamental constants used in the calculation of Young's modulus.

DESCRIPTION OF EXEMPLARY EMBODIMENTS

A preferable embodiment of the invention will be described below in detail with reference to the drawings. It is not intended that the embodiment described below unduly limits the contents of the invention set forth in the appended claims. Further, all configurations described below are not necessarily essential configuration requirements of the invention.

1. Piezoelectric Drive Apparatus for Motor

Figure 1:
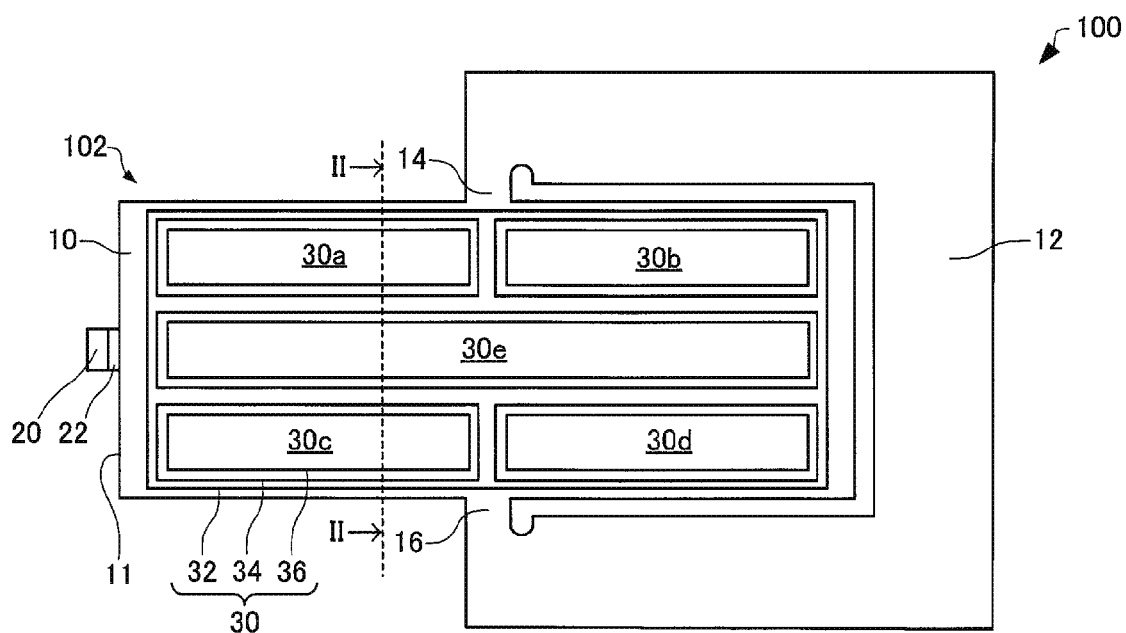
FIG. 1 is a plan view diagrammatically showing a piezoelectric drive apparatus for a motor according to an embodiment of the invention.
Figure 2:
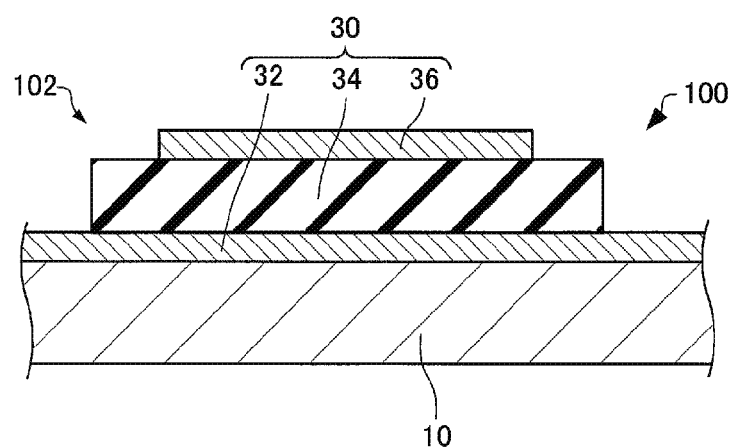
FIG. 2 is a cross-sectional view diagrammatically showing the piezoelectric drive apparatus for a motor according to the present embodiment.

A piezoelectric drive apparatus for a motor according to the present embodiment will first be described with reference to the drawings. FIG. 1 is a plan view diagrammatically showing a piezoelectric drive apparatus for a motor 100 according to the present embodiment. FIG. 2 is a cross-sectional view taken along the line II-II in FIG. 1 and diagrammatically showing the piezoelectric drive apparatus for a motor 100 according to the present embodiment.

The piezoelectric drive apparatus for a motor 100 includes a substrate 10, a fixing section 12, a first connection section 14, a second connection section 16, a contact section 20, and a piezoelectric element 30, as shown in FIGS. 1 and 2. The substrate 10, the fixing section 12, the connection sections 14 and 16, and the piezoelectric element 30 form a chip 102.

The substrate 10 has anisotropy of Young's modulus in the plane thereof. The substrate 10 is, for example, a silicon single crystal substrate. The substrate 10 may be a {110} substrate. That is, the plane orientation of the substrate 10 may be {110}. A {110} substrate is, for example, a substrate cut along the {110} plane. In the description, {110} stands for a plane equivalent to (110). Therefore, the substrate 10 may, for example, be a (110) substrate or may be a (−110) substrate. In the present specification, "1 bar" in the negative plane orientation or the negative direction of a unit lattice is expressed as "−1". The substrate 10 is not necessarily made of a specific material as long as the substrate 10 has anisotropy of Young's modulus in the plane thereof and may be a compound semiconductor substrate (GaAs substrate, for example).

The substrate 10 may instead be a {100} substrate. That is, the plane orientation of the substrate 10 may be {100}. A {100} substrate is, for example, a substrate cut along the {100} plane. In the description, {100} stands for a plane equivalent to (100). Therefore, the substrate 10 may, for example, be a (100) substrate or may be a (001) substrate.

The substrate 10 has a shape having a longitudinal direction and a widthwise direction perpendicular to the longitudinal direction in a plan view (when viewed in thickness direction of substrate 10). In the example shown in FIG. 1, the plan-view shape of the substrate 10 (shape viewed in thickness direction of substrate 10) is an oblong shape. The longitudinal direction is the direction in which the long sides of the oblong shape extend, and the widthwise direction is the direction in which the short sides of the oblong shape extend.

The piezoelectric element 30 is provided on the substrate 10, and the piezoelectric element 30, when it deforms, can cause the substrate 10 to vibrate. The fixing section 12 supports the substrate 10 via the connection sections 14 and 16. The fixing section 12 is fixed, for example, to an external member (not shown). In the example shown in FIG. 1, each of the connection sections 14 and 16 extends from a central portion of the substrate 10 in the longitudinal direction thereof along the widthwise direction of the substrate 10 and is connected to the fixing section 12.

The contact section 20 is provided at a front end section 11 of the substrate 10 in the longitudinal direction thereof. The front end section 11 is formed of a short side of the substrate 10 in the plan view. The contact section 20 is a protrusion that protrudes from the front end section 11. In the example shown in FIG. 1, the contact section 20 is attached (glued) to the front end section 11 via an adhesive 22. Although not shown, the front end section 11 may be provided with a recess, and the contact section 20 may be so provided as to be fit into the recess. In this case, the contact section 20 may be in contact with the front end section 11. The shape of the contact section 20 is a box-like shape in the example shown in FIG. 1, and the contact section 20 may instead have a spherical shape.

The contact section 20 is a member that comes into contact with a driven member (specifically, rotor 4 shown in FIG. 6, which will be described later) and transmits the motion of the substrate 10 to the driven member. The contact section 20 is made, for example, of a ceramic material (specifically, alumina ($Al_2O_3$), zirconia ($ZrO_2$), silicon nitride ($Si_3N$), or mixture thereof). The rotor 4 has, for example, a cylindrical or spherical shape.

The piezoelectric element 30 is provided on the substrate 10, as shown in FIG. 2. Although not shown, an insulating layer may be provided between the substrate 10 and the piezoelectric element 30. In this case, the piezoelectric element 30 is provided over the substrate 10 via the insulating layer. The insulating layer may be formed of a silicon oxide layer provided on the substrate 10 and a zirconium oxide layer provided on the silicon oxide layer. The piezoelectric element 30 has a first electrode 32, a piezoelectric body layer (piezoelectric body) 34, and a second electrode 36.

The first electrode 32 is provided on the substrate 10. In the example shown in FIG. 1, the first electrode 32 has an oblong plan-view shape. The first electrode 32 may be formed of an iridium layer provided on the substrate 10 and a platinum layer provided on the iridium layer. The iridium layer has a thickness, for example, greater than or equal to 5 nm but smaller than or equal to 100 nm. The platinum layer has a thickness, for example, greater than or equal to 50 nm but smaller than or equal to 300 nm. The first electrode 32 may instead be a metal layer made, for example, of Ti, Pt, Ta, Ir, Sr, In, Sn, Au, Al, Fe, Cr, Ni, or Cu, a layer made of a mixture of at least two of the elements described above, or layers made of at least two of the elements described above and stacked on each other. The first electrode 32 is one electrode for applying voltage to the piezoelectric body layer 34.

The piezoelectric body layer 34 is provided on the first electrode 32. The piezoelectric body layer 34 is positioned between the first electrode 32 and the second electrode 36. In the example shown in FIG. 1, the piezoelectric body layer 34 has an oblong plan-view shape. The piezoelectric body layer 34 has a thickness, for example, greater than or equal to 50 nm but smaller than or equal to 20 μm, preferably greater than or equal to 1 μm but smaller than or equal to 7 μm. The piezoelectric element 30 is a thin-film piezoelectric element, as described above. When the thickness of the piezoelectric body layer 34 is smaller than 50 nm, the output from the piezoelectric drive apparatus for a motor 100 is insufficient in some cases. Specifically, increasing the voltage applied to the piezoelectric body layer 34 to increase the output causes dielectric breakdown of the piezoelectric body layer 34 in some cases. When the thickness of the piezoelectric body layer 34 is greater than 20 μm, the piezoelectric body layer 34 cracks in some cases.

The piezoelectric material of the piezoelectric body layer 34 is a perovskite-type oxide. Specifically, the piezoelectric body layer 34 is made, for example, of a lead zirconate titanate (Pb(Zr,Ti) $O_3$: PZT) or a lead zirconate titanate niobate (Pb Zr,Ti,Nb) $O_3$: PZTN). The piezoelectric body layer 34 is allowed to deform (extend and contract) when voltage is applied thereto through the electrodes 32 and 36.

The second electrode 36 is provided on the piezoelectric body layer 34. In the example shown in FIG. 1, the second electrode 36 has an oblong plan-view shape. The second electrode 36 may be formed of an intimate contact layer provided on the piezoelectric body layer 34 and an electrically conducting layer provided on the intimate contact layer. The intimate contact layer has a thickness, for example, greater than or equal to 10 nm but smaller than or equal to 100 nm. The intimate contact layer is, for example, a TiW layer, a Ti layer, a Cr layer, a NiCr layer, or a stacked body formed thereof. The electrically conducting layer has a thickness, for example, greater than or equal to 1 μm but smaller than or equal to 10 μm. The electrically conducting layer is, for example, a Cu layer, an Au layer, an Al layer, or a stacked body formed thereof. The second electrode 36 is the other electrode for applying voltage to the piezoelectric body layer 34.

The piezoelectric element 30 is formed of a plurality of piezoelectric elements. In the example shown in FIG. 1, the piezoelectric element 30 is formed of five piezoelectric elements (piezoelectric elements 30a, 30b, 30c, 30d, and 30e). In the plan view, for example, the piezoelectric elements 30a to 30d have the same area, and the piezoelectric element 30e has an area greater than those of the piezoelectric elements 30a to 30d. The piezoelectric element 30e is provided in a central portion of the substrate 10 in the widthwise direction thereof and along the longitudinal direction of the substrate 10. The piezoelectric elements 30a, 30b, 30c, and 30d are provided at the four corners of the substrate 10. In the example shown in FIG. 1, the first electrode 32 is provided as one continuous electrically conducting layer in the piezoelectric elements 30a to 30d.

Although not shown, the piezoelectric drive apparatus for a motor 100 may include an insulating layer so provided as to cover the piezoelectric element 30, a first wiring layer electrically connected to the first electrode 32, and a second wiring layer electrically connected to the second electrodes 36.

Figure 3:
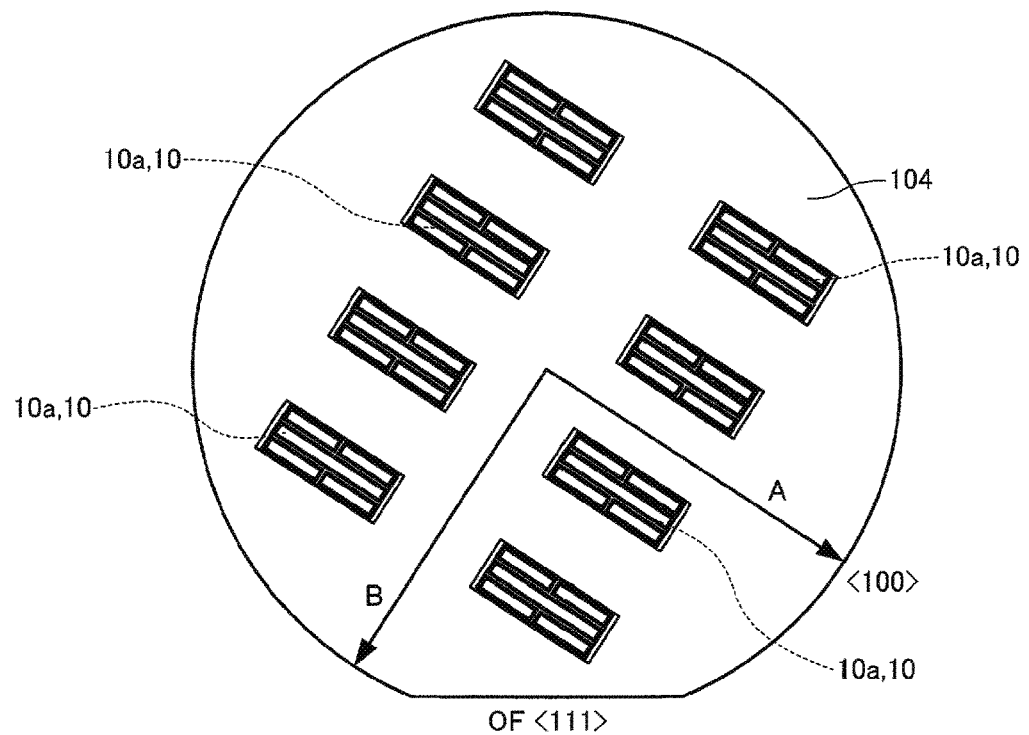
FIG. 3 is a plan view for describing the longitudinal direction of a substrate.
Figure 4:
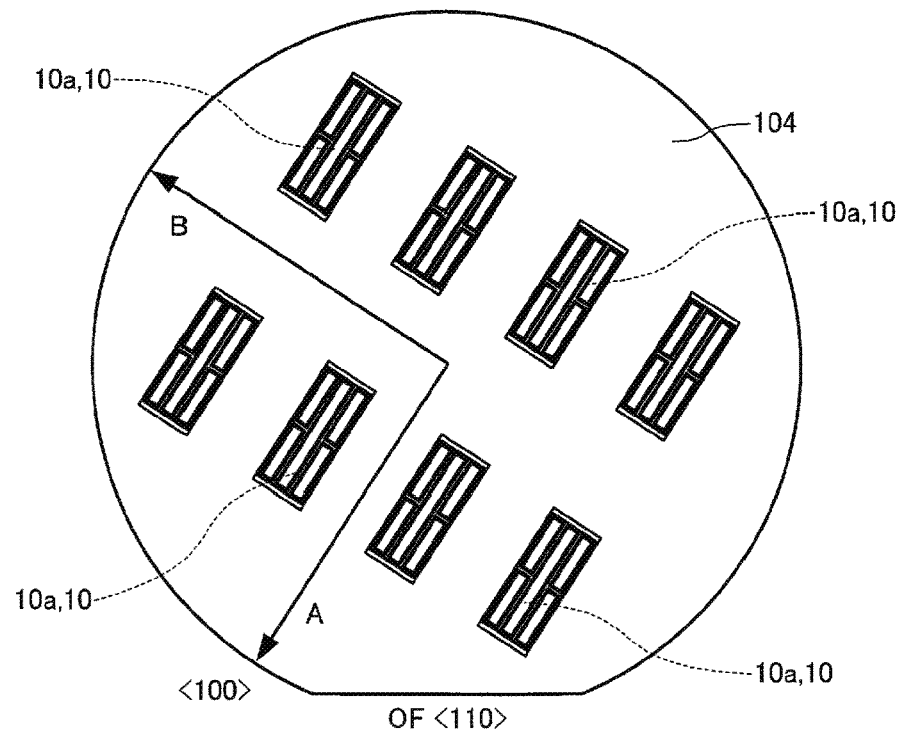
FIG. 4 is a plan view for describing the longitudinal direction of the substrate.

FIGS. 3 and 4 are plan views for describing the longitudinal direction A of the substrate 10. In FIGS. 3 and 4 and in FIG. 6, which will be described later, the fixing section 12 and the connection sections 14 and 16 are omitted for convenience.

A plurality of chips 102 can be acquired from one wafer 104 by formation of a plurality of chip regions 10a on the wafer 104, as shown in FIGS. 3 and 4. In the examples shown in FIGS. 3 and 4, the number of chip regions 10a is eight but is not limited to a specific number. Each of the chip regions 10a is a region that forms the substrate 10. Each of the chips 102 is formed of the substrate 10 and the piezoelectric element 30.

FIG. 3 shows a case where the wafer 104 is a {110} wafer. That is, the substrate 10 is a {110} substrate. FIG. 4 shows a case where the wafer 104 is a {100} wafer. That is, the substrate 10 is a {100} substrate. In FIGS. 3 and 4, "OF" means an orientation flat.

In the case where the wafer 104 is a {110} wafer, the longitudinal direction A of the chip regions 10a, each of which forms the substrate 10, roughly coincides with the <100> direction (orientation), as shown in FIG. 3. In the example shown in FIG. 3, the longitudinal direction A completely coincides with the <100> direction. The <100> direction represents a direction equivalent to the [100] direction. The longitudinal direction A therefore roughly coincides, for example, with the [100] direction, the [010] direction, the [−100] direction, the [0-10] direction, the [001] direction, or the [00-1] direction. Specifically, in the case where the wafer 104 is a (110) wafer, the longitudinal direction A is the [001] direction. In the example shown in FIG. 3, the orientation flat is located in the <111> direction (for example, in the case where the wafer 104 is a (110) wafer, the orientation flat is located in the [−111] direction).

The phrase "a direction α roughly coincides with a direction β" used herein means that an inclination angle θ of a first axis parallel to the direction α with respect to a second axis parallel to the direction β is 20° or smaller, preferably 15° or smaller, more preferably 5° or smaller.

In the case where the wafer 104 is a {100} wafer, the longitudinal direction A of the chip regions 10a, each of which forms the substrate 10, roughly coincides with the <100> direction, as shown in FIG. 4. In the example shown in FIG. 4, the longitudinal direction A completely coincides with the <100> direction. Specifically, in the case where the wafer 104 is a (001) wafer, the longitudinal direction A is the [100] direction. In the example shown in FIG. 4, the orientation flat is located in the <110> direction (for example, in the case where the wafer 104 is a (001) wafer, the orientation flat is located in the [110] direction).

In the case where the substrate 10 is a {110} substrate or a {100} substrate, the <100> direction is the direction in which Young's modulus is minimized in the plane of the substrate 10 (see "3. Experiment," which will be described later). Further, the <100> direction is the direction in which Ey/Ex/Gxy is maximized in the plane of the substrate 10, where Gxy represents the shear elastic coefficient of the substrate 10 in the widthwise direction B thereof, Ex represents Young's modulus of the substrate 10 in the longitudinal direction A thereof, and Ey represents Young's modulus of the substrate 10 in the widthwise direction B thereof (see "3. Experiment," which will be described later).

Figure 5:
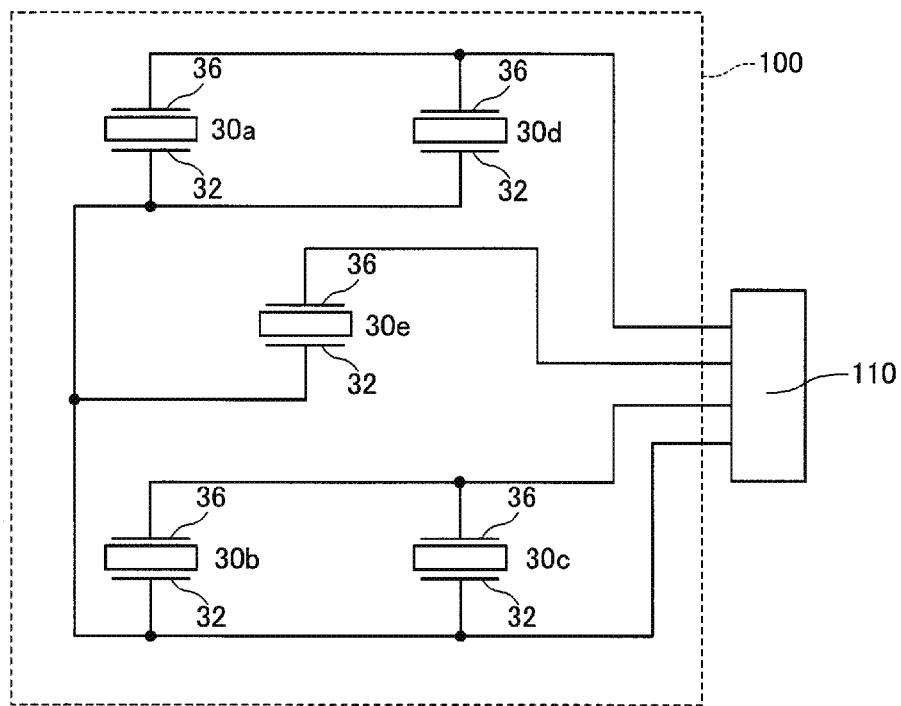
FIG. 5 shows an equivalent circuit for describing the piezoelectric drive apparatus for a motor according to the present embodiment.

FIG. 5 shows an equivalent circuit for describing the piezoelectric drive apparatus for a motor 100. The piezoelectric element 30, which is formed of a plurality of piezoelectric elements, is divided into three groups. A first group has two piezoelectric elements 30a and 30d. A second group has two piezoelectric elements 30b and 30c. A third group has only one piezoelectric element 30e. The piezoelectric elements 30a and 30d in the first group are connected in parallel to each other and further connected to a drive circuit 110, as shown in FIG. 5. The piezoelectric elements 30b and 30c in the second group are connected in parallel to each other and further connected to the drive circuit 110. The piezoelectric element 30e in the third group alone is connected to the drive circuit 110.

The drive circuit 110 applies AC voltage or pulsating voltage that periodically changes to a predetermined one of the five piezoelectric elements 30a, 30b, 30c, 30d, and 30e. For example, the drive circuit 110 applies the voltage between the first electrode 32 and the second electrodes 36 of the piezoelectric elements 30a, 30d, and 30e. The piezoelectric drive apparatus for a motor 100 thus causes the substrate 10 to undergo ultrasonic vibration, whereby the rotor (driven member) in contact with the contact section 20 can be rotated in a predetermined rotation direction. The term "pulsating voltage" used herein means voltage formed of AC voltage to which a DC offset is added, and the direction of the pulsating voltage (electric field) is the one-way direction from one of the electrodes toward the other electrode.

The electric field is preferably directed from the second electrode 36 toward the first electrode 32 instead of the direction from the first electrode 32 toward the second electrode 36. Application of the AC voltage or the pulsating voltage between the electrodes 32 and 36 of the piezoelectric elements 30b, 30c, and 30e allows the rotor in contact with the contact section 20 to rotate in the reverse direction.

Figure 6:
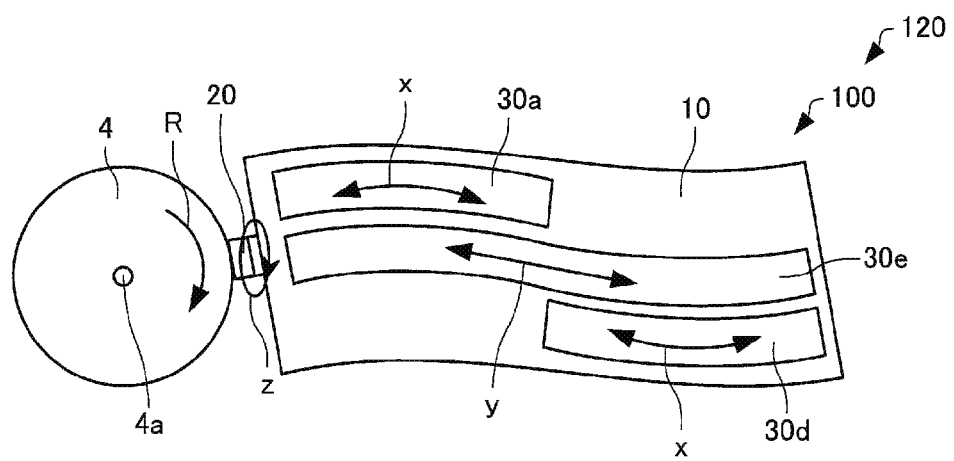
FIG. 6 describes the action of the piezoelectric drive apparatus for a motor according to the present embodiment.

FIG. 6 describes the action of the substrate 10 of the piezoelectric drive apparatus for a motor 100. The contact section 20 of the piezoelectric drive apparatus for a motor 100 is in contact with the outer circumference of the rotor 4 as the driven member, as shown in FIG. 6. The drive circuit 110 applies the AC voltage or the pulsating voltage between the electrodes 32 and 36 of the piezoelectric elements 30a and 30d. As a result, the piezoelectric elements 30a and 30d extend and contract in the direction indicated by the arrows x. In response to the extending and contracting action, the substrate 10 undergoes bending vibration in the plane of the substrate 10 so as to deform in a serpentine shape (S-letter shape). The drive circuit 110 further applies the AC voltage or the pulsating voltage between the electrodes 32 and 36 of the piezoelectric element 30e. As a result, the piezoelectric element 30e extends and contracts in the direction indicated by the arrow y. The substrate 10 therefore undergoes vertical vibration in the plane of the substrate 10. The bending vibration and the vertical vibration of the substrate 10 described above cause the contact section 20 to perform elliptical motion, as indicated by the arrow z. As a result, the rotor 4 rotates around the center 4a thereof in a predetermined direction R (clockwise in the example shown in FIG. 6).

When the drive circuit 110 applies the AC voltage or the pulsating voltage between the electrodes 32 and 36 of the piezoelectric elements 30b, 30c, and 30e, the rotor 4 rotates in the direction opposite the direction R (counterclockwise).

The resonance frequency of the bending vibration of the substrate 10 is preferably equal to the resonance frequency of the vertical vibration of the substrate 10. In this case, the piezoelectric drive apparatus for a motor 100 can efficiently rotate the rotor 4.

A motor 120 according to the present embodiment includes a piezoelectric drive apparatus for a motor according to an embodiment of the invention (piezoelectric drive apparatus for a motor 100 in the example shown in FIG. 6) and the rotor 4 rotated by the piezoelectric drive apparatus for a motor 100, as shown in FIG. 6. The rotor 4 is made, for example, of a ceramic material. In the example shown in FIG. 6, the rotor 4 has a cylindrical shape.

The piezoelectric drive apparatus for a motor 100, for example, has the following features.

In the piezoelectric drive apparatus for a motor 100, the longitudinal direction of the substrate 10 roughly coincides with the direction in which Young's modulus is minimized in the plane of the substrate 10. Therefore, in the piezoelectric drive apparatus for a motor 100, for example, when voltage is applied to the piezoelectric element 30, large displacement (amplitude) of the bending vibration of the substrate 10 is achieved, whereby high output is provided (see "3. Experiment," which will be described later). The piezoelectric drive apparatus for a motor 100 therefore allows, for example, improvement in efficiency (output/voltage applied to piezoelectric element 30).

In the piezoelectric drive apparatus for a motor 100, the longitudinal direction of the substrate 10 roughly coincides with the direction in which the value of Ey/Ex/Gxy is maximized in the plane of the substrate 10. Therefore, in the piezoelectric drive apparatus for a motor 100, when voltage is applied to the piezoelectric element 30, large displacement of the bending vibration of the substrate 10 is achieved, whereby high output is provided (see "3. Experiment," which will be described later). The piezoelectric drive apparatus for a motor 100 therefore allows, for example, improvement in the efficiency.

A conceivable example of the structure in which a piezoelectric element is provided on a silicon substrate is a liquid ejection head used in an inkjet printer. In a liquid ejection head, however, no silicon substrate is used as a vibrating body that is caused to vibrate by a piezoelectric element, and no silicon substrate is present immediately below the piezoelectric element. Therefore, in a liquid ejection head, a member located immediately below the piezoelectric element has a small thickness, and the member warps due, for example, to stress in some cases. The piezoelectric body layer therefore cracks in some cases. In contrast, in the piezoelectric drive apparatus for a motor, in which the thick silicon substrate (about 100 μm in thickness, for example) is present immediately below the piezoelectric element, a situation in which the piezoelectric body layer cracks can be avoided.

2. Method for Manufacturing Piezoelectric Drive Apparatus for Motor

Figure 7:
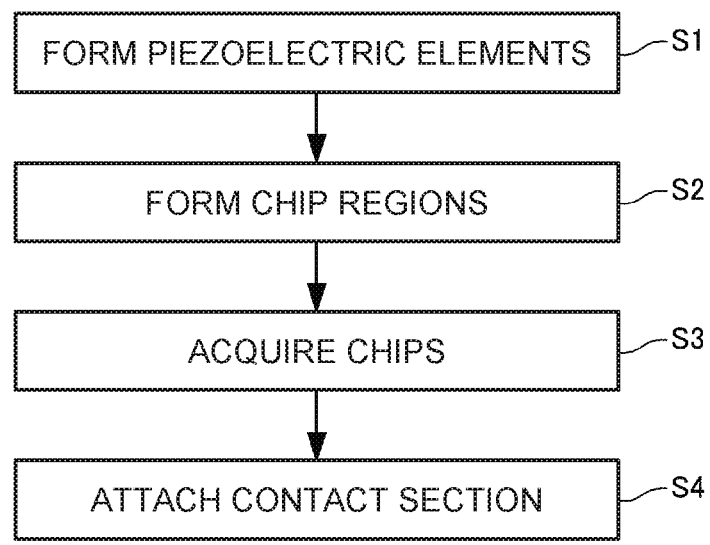
FIG. 7 is a flowchart for describing a method for manufacturing the piezoelectric drive apparatus for a motor according to the present embodiment.
Figure 8:
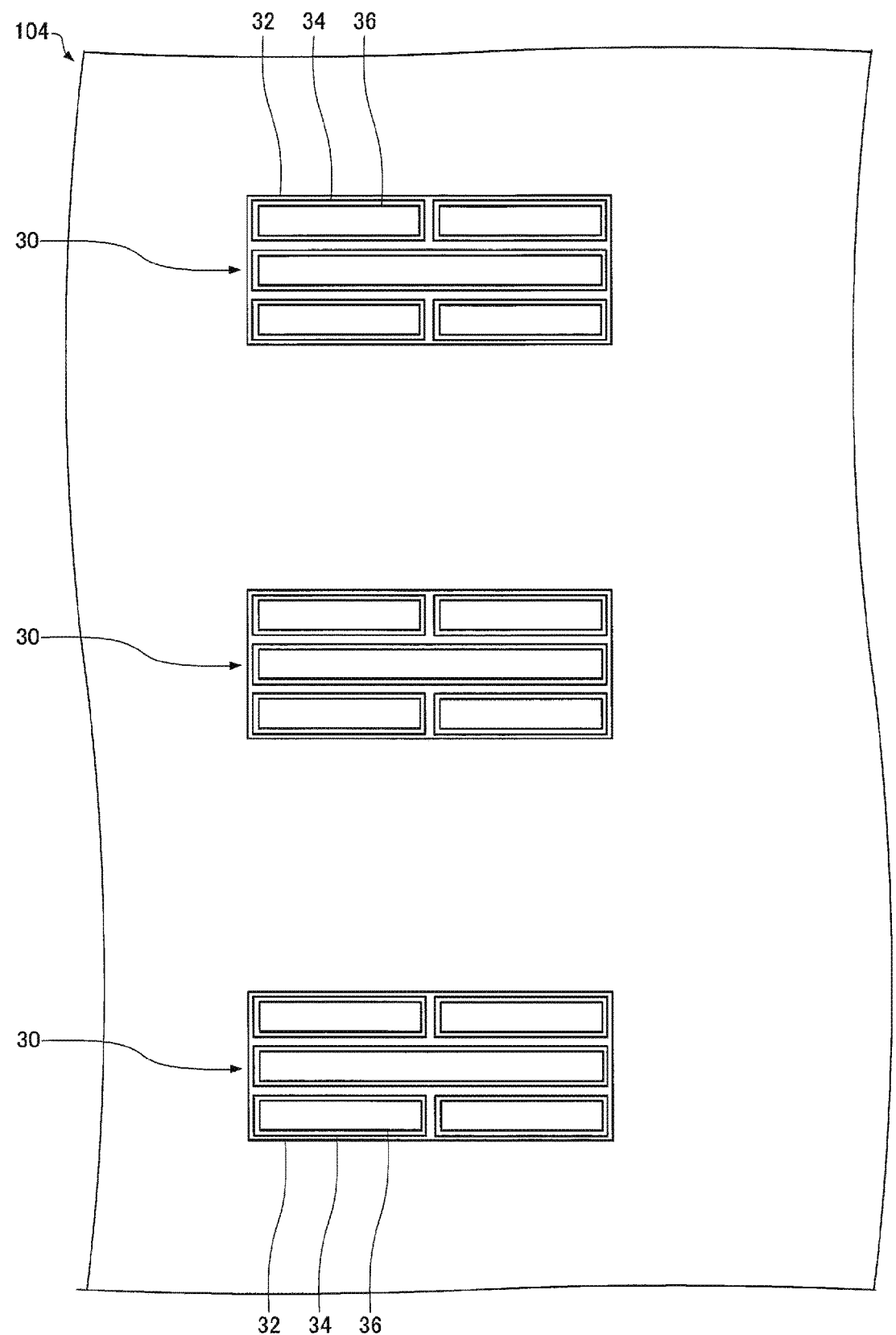
FIG. 8 is a plan view diagrammatically showing the steps of manufacturing the piezoelectric drive apparatus for a motor according to the present embodiment.
Figure 9:
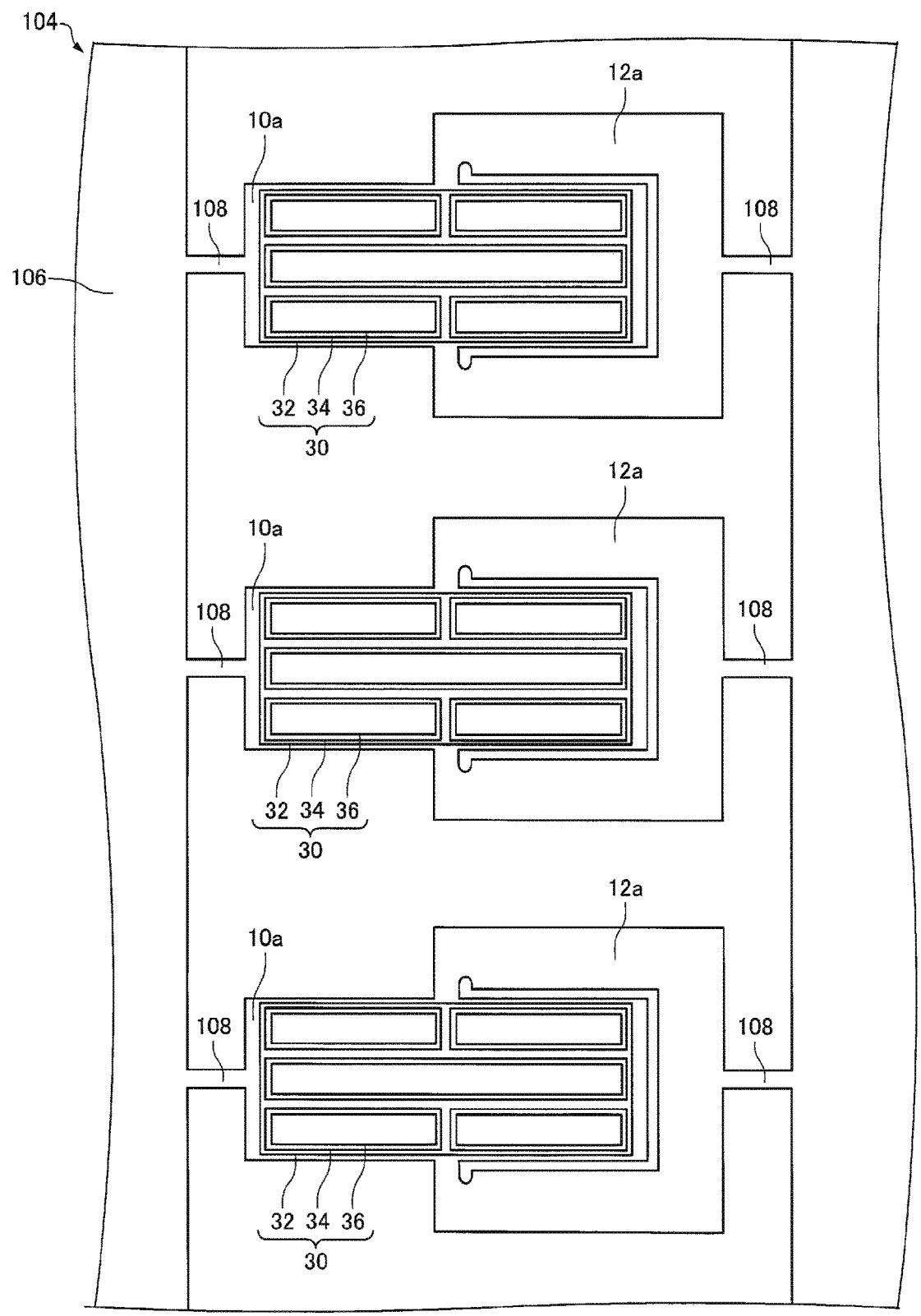
FIG. 9 is a plan view diagrammatically showing the steps of manufacturing the piezoelectric drive apparatus for a motor according to the present embodiment.

A method for manufacturing the piezoelectric drive apparatus for a motor according to the present embodiment will next be described with reference to the drawings. FIG. 7 is a flowchart for describing the method for manufacturing the piezoelectric drive apparatus for a motor 100 according to the present embodiment. FIGS. 8 and 9 are plan views diagrammatically showing the steps of manufacturing the piezoelectric drive apparatus for a motor 100 according to the present embodiment.

A plurality of piezoelectric elements 30 are formed on the wafer 104 (S1), as shown in FIG. 8. Specifically, the first electrodes 32 are first formed on the wafer 104. The first electrodes 32 are formed in a film formation process using, for example, a sputtering method, a CVD (chemical vapor deposition) method, and a vacuum evaporation method, and a patterning process (patterning using photolithography and etching). The wafer 104 is, for example, a silicon single crystal wafer.

The piezoelectric body layers 34 are then formed on each of the first electrodes 32. The piezoelectric body layers 34 are formed, for example, by repeated formation of a precursor layer by using a liquid phase method and crystallization of the precursor layer and then patterning of the crystallized precursor layer. The liquid phase method is a method in which a raw material liquid containing a material that forms a thin film (piezoelectric body layer) is used to form a film made of the thin-film material and is specifically a sol-gel method, an MOD (metal organic deposition) method, and other methods. The crystallization is performed, for example, by a heat treatment at a temperature ranging from 700 to 800° C. in an oxygen atmosphere.

The second electrodes 36 are then formed on each of the piezoelectric body layers 34. The second electrodes 36 are formed, for example, by using the same method for forming the first electrode 32. Although not shown, the patterning of the second electrodes 36 and the patterning of the piezoelectric body layers 34 may be performed as the same step.

The plurality of piezoelectric elements 30 can thus be formed on the wafer 104 by carrying out the steps described above.

The chip regions 10a having the longitudinal direction and the widthwise direction perpendicular to the longitudinal direction are formed on the wafer 104 (S2), as shown in FIG. 9. The plurality of chip regions 10a are formed in correspondence with the piezoelectric elements 30 for example, by patterning of the wafer 104. That is, the wafer 104 is so patterned that one piezoelectric element 30 is provided on one chip region 10a. Specifically, the wafer 104 is so patterned as to form the chip regions 10a, each of which forms the substrate 10, peripheral regions 12a, each of which forms the fixing section 12 and the connection sections 14 and 16, and a support section 106, which supports the chip regions 10a and the peripheral regions 12a via beams 108. In the example shown in FIG. 9, each of the chip regions 10a is provided with two beams 108, but the number of beams 108 is not limited to a specific value. The patterning is performed, for example, by photolithography and etching.

In the case where the wafer 104 is a {110} wafer, the chip regions 10a are so formed that the longitudinal direction of the chip regions 10a roughly coincides with the <100> direction. In the case where the wafer 104 is a {100} wafer, the chip regions 10a are so formed that the longitudinal direction of the chip regions 10a roughly coincides with the <100> direction.

A chip region 10a and a peripheral region 12a are extracted from the wafer 104 to acquire a chip 102 (S3), as shown in FIG. 1. Specifically, the beams 108 shown in FIG. 9 are cut (broken, for example), and the chip regions 10a and the peripheral regions 12a are separated from the support section 106. A plurality of chips 102 can be acquired by carrying out the present step.

The contact section 20 is then attached to the front end section 11 of the substrate 10 in the longitudinal direction thereof (of chip region 10a in longitudinal direction thereof) (S4). For example, the contact section 20 is attached to the front end section 11 through an adhesive 22. It is noted that the recess may be provided in the front end section 11, and the contact section 20 may be so disposed as to be in contact with the recess.

The piezoelectric drive apparatus for a motor 100 can thus be manufactured by carrying out the steps described above.

In the method for manufacturing the piezoelectric drive apparatus for a motor 100, the piezoelectric drive apparatus for a motor 100 can be so manufactured as to provide high output.

3. Experimental Examples

The invention will be more specifically described by showing experimental examples below. It is not intended that the following experimental examples limit the scope of the invention.

3.1. Simulation of Crystal Orientation and Parameters

Figure 10:
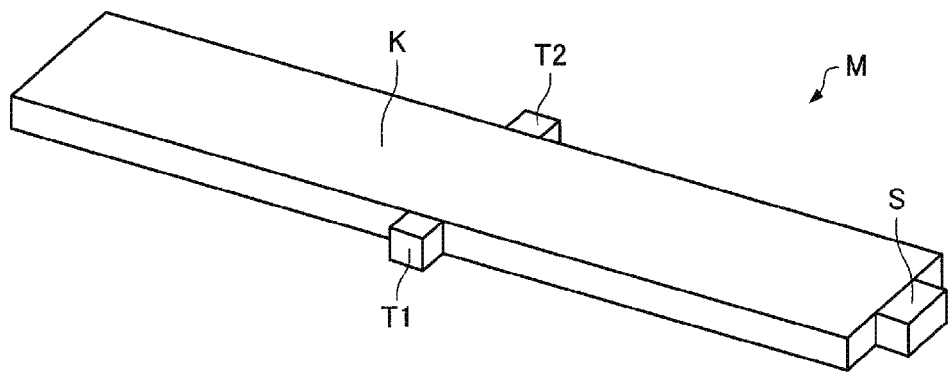
FIG. 10 is a perspective view for describing a model used in experimental examples.

A model M shown in FIG. 10 was used to perform a simulation based on a finite element method. The model M has a substrate K, a contact section S, which is provided at a front end section of the substrate K in the longitudinal direction thereof, and first connection section T1 and a second connection section T2, which are provided in a central portion of the substrate K in the longitudinal direction thereof. It was assumed that the substrate K has a fixed longitudinal length of 3.5 mm.

In the present simulation, the following parameters are determined with the plane orientation of the substrate K, the orientation of the longitudinal direction, and the orientation of the widthwise direction changed: Young's modulus Ex of the substrate K in the longitudinal direction thereof; Young's modulus Ey of the substrate K in the widthwise direction thereof; the shear elastic coefficient Gxy of the substrate K in the widthwise direction thereof; the value of Ey/Ex/Gxy; the Poisson ratio νxy of the substrate K; the resonance frequency F of the substrate K; the length W of the substrate K in the widthwise direction thereof; the ratio of the amount of displacement of the vertical vibration of the substrate K (vertical displacement ratio); the ratio of the amount of displacement of the bending vibration of the substrate K (bending displacement ratio); and a displacement ratio that is the product of the amount of displacement of the vertical vibration of the substrate K and the amount of displacement of the horizontal vibration of the substrate K (ratio of vertical displacement multiplied by bending displacement).

The shear elastic coefficient Gxy of the substrate K in the widthwise direction thereof was determined by using the following Expression (1).

$$Gxy=(Ex \times Ey)/(Ex+Ey+2 \times Ey \times vxy) \quad (1)$$

The resonance frequency of the vertical vibration of the substrate K is determined by the plane orientation of the substrate K and the orientation in the longitudinal direction because the substrate K has a fixed length of 3.5 mm in the longitudinal direction. The length of the substrate K in the widthwise direction thereof is therefore so adjusted that the resonance frequency of the bending vibration of the substrate K is equal to the resonance frequency of the vertical vibration of the substrate K.

Assuming that a model having a plane orientation of the substrate K of (110), an orientation of the longitudinal direction of <111>, and an orientation of the widthwise direction of <112> provides displacement ratios of 100%, the displacement ratios with respect to the model were determined.

Figure 12:
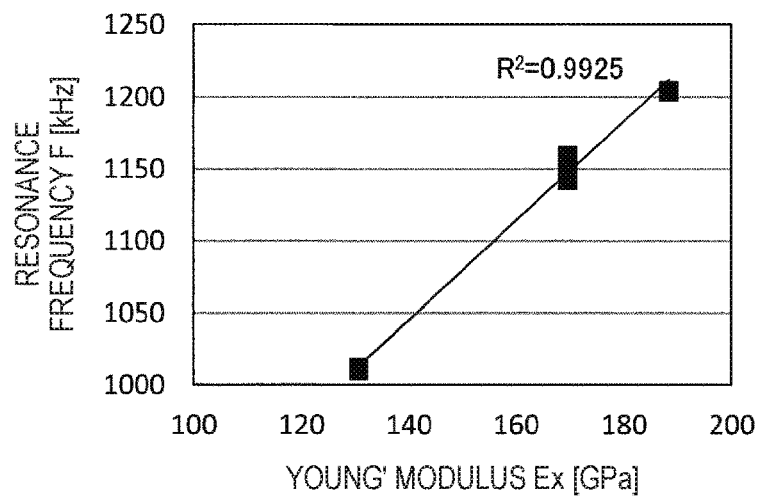
FIG. 12 is a graph showing the relationship between Young's modulus Ex of a substrate in the longitudinal direction thereof and the resonance frequency F of the substrate.
Figure 13:
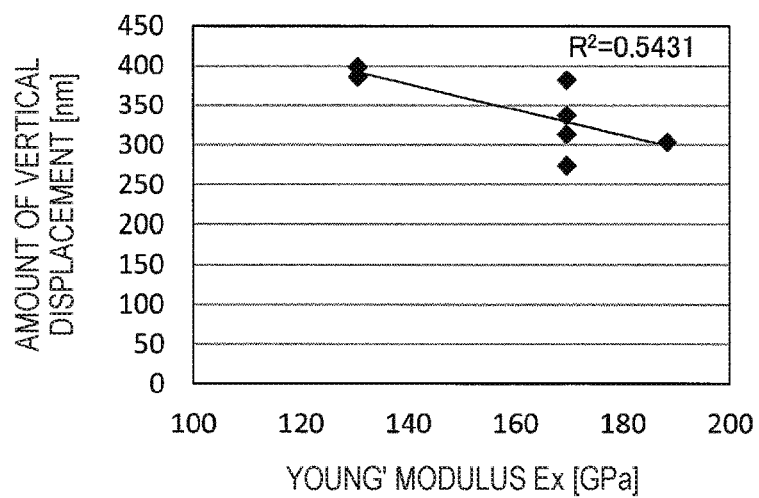
FIG. 13 is a graph showing the relationship between Young's modulus Ex of the substrate in the longitudinal direction thereof and the amount of displacement of vertical vibration of the substrate.
Figure 14:
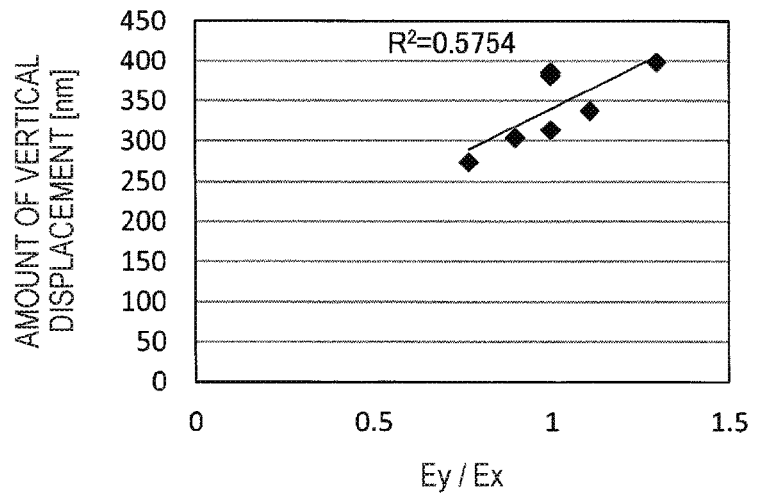
FIG. 14 is a graph showing the relationship between the value of Ey/Ex and the amount of displacement of the vertical displacement of the substrate.
Figure 15:
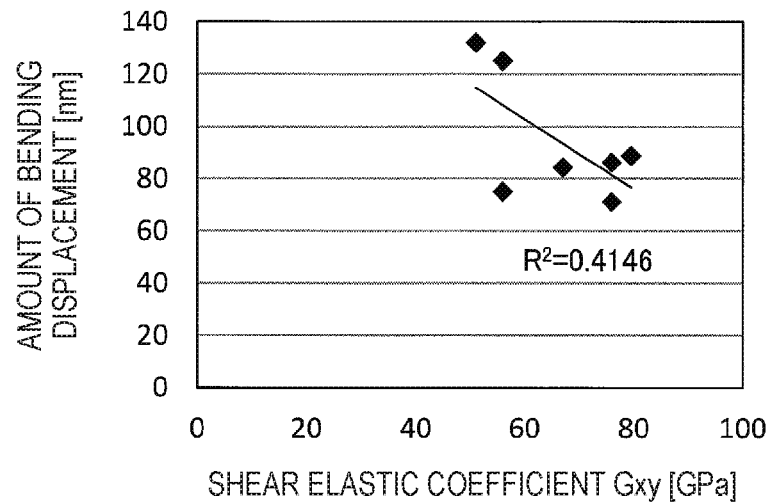
FIG. 15 is a graph showing the relationship between the shear elastic coefficient Gxy of the substrate in the widthwise direction thereof and the amount of displacement of bending vibration of the substrate.
Figure 16:
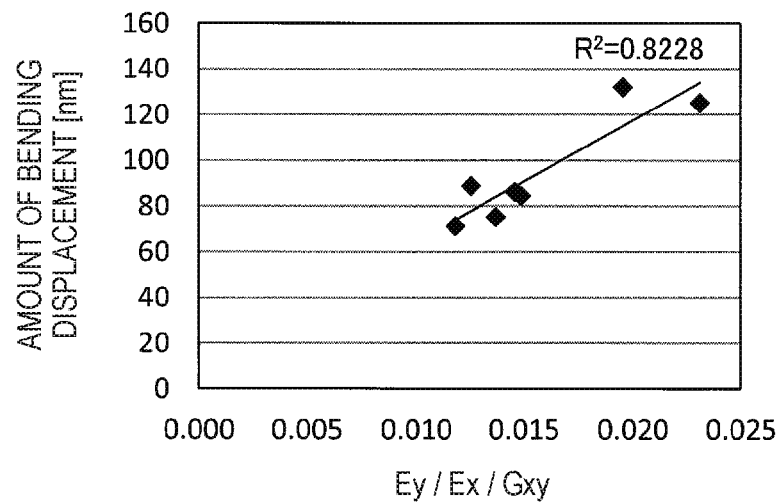
FIG. 16 is a graph showing the relationship between the value of Ey/Ex/Gxy and the amount of displacement of the bending displacement of the substrate.

FIG. 11 is a table showing the crystal orientation and the parameters in models M1 to M7. FIG. 12 is a graph showing the relationship between Young's modulus Ex of the substrate K in the longitudinal direction thereof and the resonance frequency F of the substrate K. FIG. 13 is a graph showing the relationship between Young's modulus Ex of the substrate K in the longitudinal direction thereof and the amount of displacement of the vertical vibration of the substrate K (amount of vertical displacement). FIG. 14 is a graph showing the relationship between the value of Ey/Ex and the amount of vertical displacement of the substrate K. FIG. 15 is a graph showing the relationship between the shear elastic coefficient Gxy of the substrate K in the widthwise direction thereof and the amount of displacement of the bending vibration of the substrate K (amount of bending displacement). FIG. 16 is a graph showing the relationship between the value of Ey/Ex/Gxy and the amount of bending displacement of the substrate K. In FIGS. 12 to 16, each of the amount of vertical displacement and the amount of bending displacement is the amount of displacement (amplitude) on the assumption that a voltage of 1 V is applied to the piezoelectric element.

In each of the models M3 and M5, the bending displacement ratio is at least 170% and the ratio of the vertical displacement multiplied by the bending displacement is at least 230% as shown in FIG. 11. That is, both the bending displacement ratio and the ratio of the vertical displacement multiplied by the bending displacement are very large values. A piezoelectric drive apparatus can provide high output when the bending displacement ratio or the ratio of the vertical displacement multiplied by the bending displacement has a large value. It is therefore found that increased output from a piezoelectric drive apparatus can be achieved by setting the plane orientation of the substrate K to be (110) or (100) and the orientation of the longitudinal direction of the substrate K to be <100>.

Further, it is a basic tendency that the bending displacement increases when the shear elastic coefficient Gxy decreases, but FIGS. 15 and 16 show that the value of Ey/Ex/Gxy more closely correlates with the amount of bending displacement than the shear elastic coefficient Gxy. The reason for this is that the vibration mode of the substrate in the widthwise direction differs from the deformation mode of the piezoelectric element.

In typical elastic deformation, when a substrate extends in the longitudinal direction, the substrate contracts in the widthwise direction. In the vibration mode of the substrate, the substrate therefore vibrates as shown in FIG. 17. On the other hand, in the deformation mode in the d31 direction of a piezoelectric element, when the element extends in the longitudinal direction, the element also extends in the widthwise direction, as shown in FIG. 18. Since the proportion of decrease in the amount of displacement due to the difference in the mode is affected by the ratio between Young's modulus in the widthwise direction and the Young's modulus in the longitudinal direction Ey/Ex, it can be said that the value of Ey/Ex/Gxy correlates well with the amount of bending displacement. In FIGS. 17 and 18, the solid lines represent the state before deformation, and the broken lines represent the state after the deformation.

Further, in each of the models M3 and M5, the resonance frequency F is lower than those in the models M1, M2, M4, M6, and M7. When the resonance frequency is low, the amount of drive current for driving the piezoelectric element can be reduced, whereby the amount of generated heat can be reduced.

Moreover, in each of the models M3 and M5, the length W in the widthwise direction is shorter than those in the models M1, M2, M4, M6, and M7. When the length W in the widthwise direction is short, the capacity can be reduced, and the number of chips that can be acquired from one wafer can be increased.

3.2. Calculation of Young's Modulus in Plane of Silicon Wafer

Young's modulus in the plane of a silicon wafer was calculated. Young's modulus was calculated by using an elastic stiffness matrix. FIG. 19 is a table showing silicon fundamental constants used in the calculation of Young's modulus. In FIG. 19, "cij" represents stiffness, and "sij" represents compliance.

Figure 20:
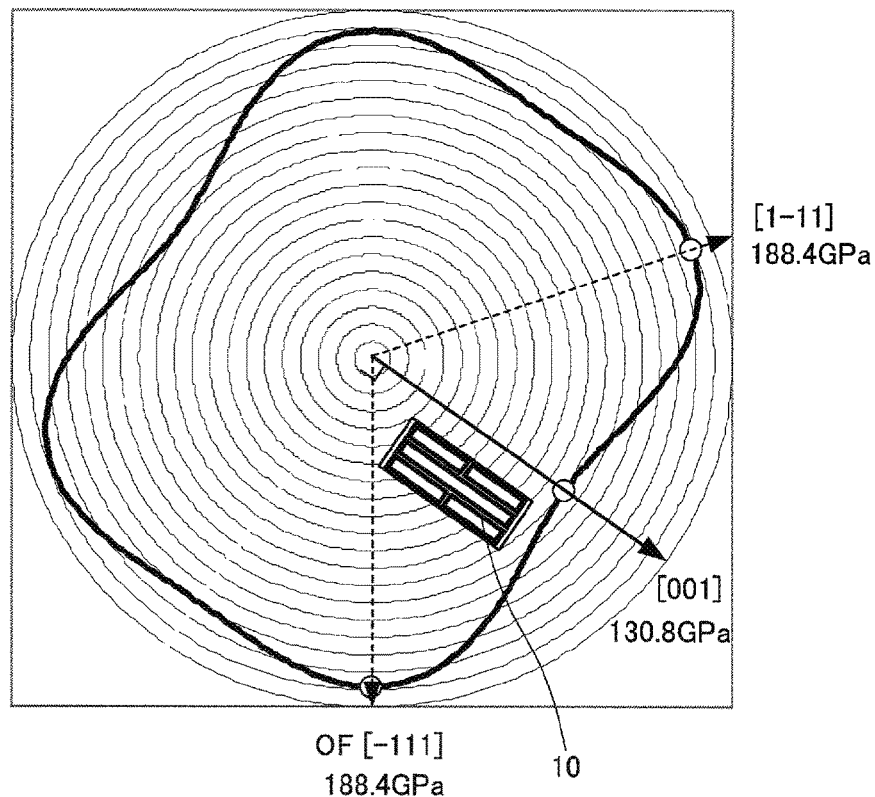
FIG. 20 shows an in-plane distribution of Young's modulus in a silicon wafer.
Figure 21:
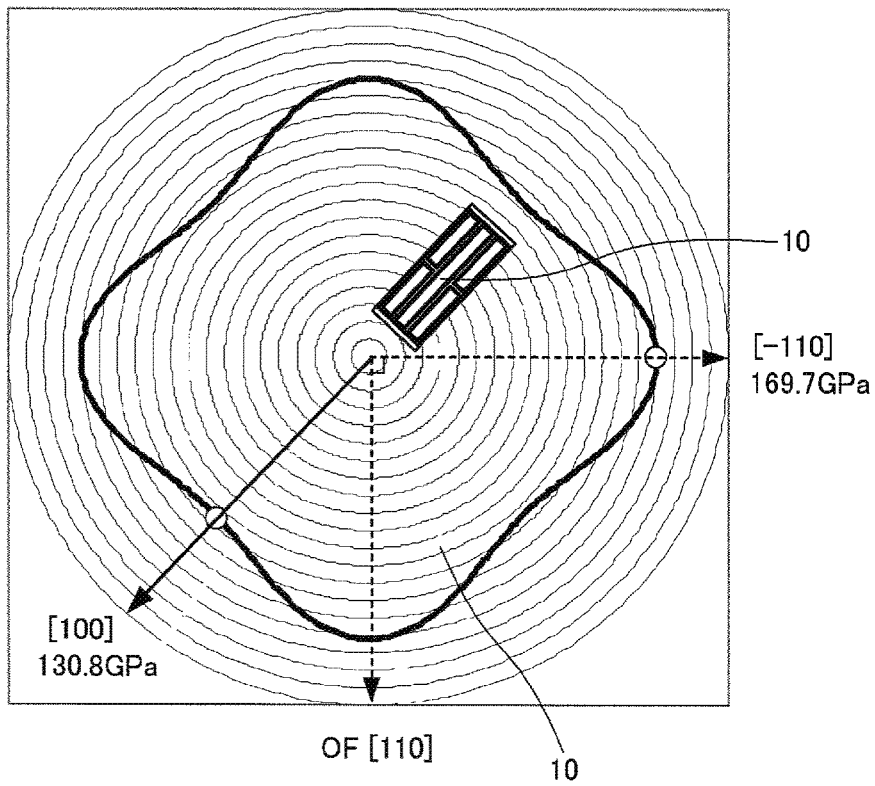
FIG. 21 shows an in-plane distribution of Young's modulus in a silicon wafer.

FIGS. 20 and 21 show an in-plane distribution of Young's modulus in a silicon wafer calculated by using the method described above. FIG. 20 shows the distribution in a (110) silicon wafer, and FIG. 21 shows the distribution in a (001) silicon wafer. In FIGS. 20 and 21, the thick lines each represent the Young's modulus distribution. In FIG. 20, the orientation flat is located in the [−111] direction. In FIG. 21, the orientation flat is located in the [110] direction.

In the (110) silicon wafer, Young's modulus in the plane of the wafer is minimized or has the smallest value of 130.8 GPa in the [001] direction, as shown in FIG. 20. It is therefore found that setting the longitudinal direction of the substrate 10, which forms the piezoelectric drive apparatus, to be the [001] direction (<100> direction) allows the longitudinal direction of the substrate 10 to coincide with the direction in which Young's modulus is minimized in the plane of the substrate 10.

In the (001) silicon wafer, Young's modulus in the plane of the wafer is minimized or has the smallest value of 130.8 GPa in the [100] direction, as shown in FIG. 21. It is therefore found that setting the longitudinal direction of the substrate 10, which forms the piezoelectric drive apparatus, to be the [100] direction (<100> direction) allows the longitudinal direction of the substrate 10 to coincide with the direction in which Young's modulus is minimized in the plane of the substrate 10.

The simulation in the section "3.1." described above and FIGS. 20 and 21 show that in the case where the substrate 10 is a {110} substrate or a {100} substrate, setting the longitudinal direction of the substrate 10 to be the <100> direction, in which Young's modulus is minimized in the plane of the substrate 10, allows increases in the bending displacement ratio and the ratio between the vertical displacement multiplied by the bending displacement.

3.3. Calculation of Value of Ey/Ex/Gxy in Plane of Silicon Wafer

Figure 22:
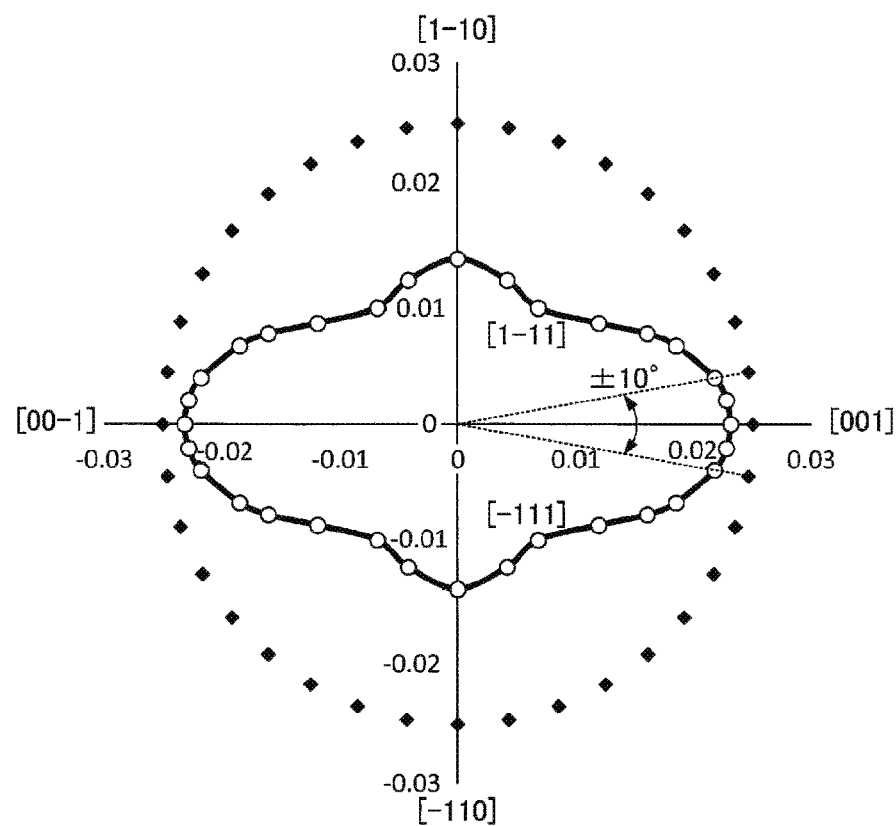
FIG. 22 shows an in-plane distribution of the value of Ey/Ex/Gxy in a silicon wafer.
Figure 23:
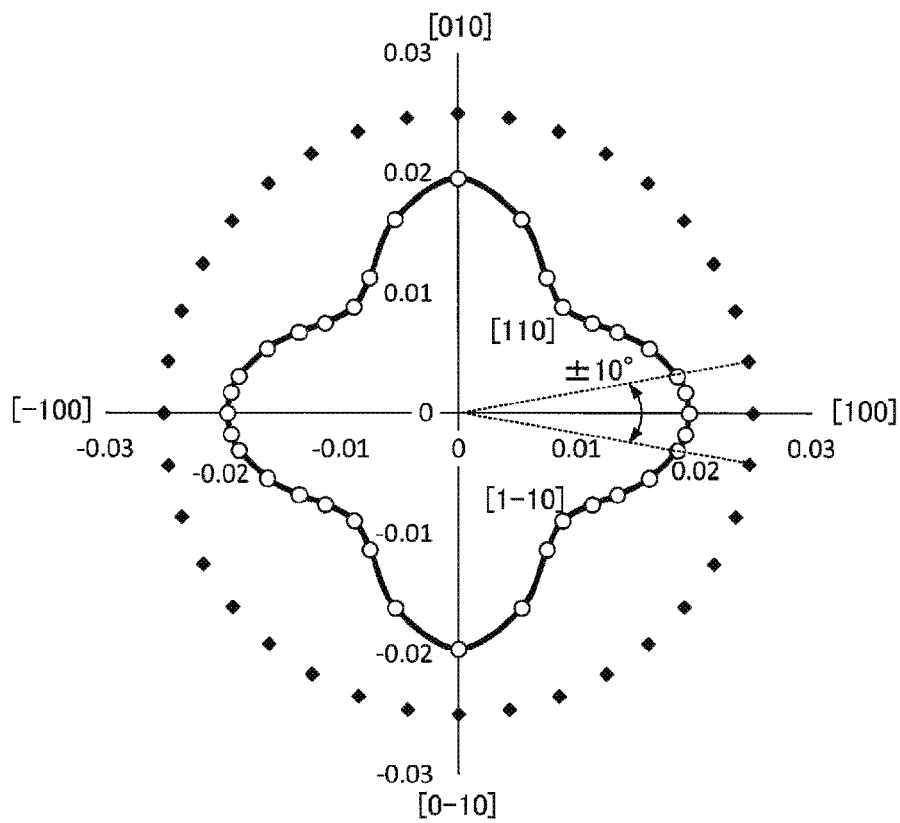
FIG. 23 shows an in-plane distribution of the value of Ey/Ex/Gxy in a silicon wafer.

FIGS. 22 and 23 each show an in-plane distribution of the value of Ey/Ex/Gxy in a silicon wafer. FIG. 22 shows the distribution in a (110) silicon wafer, and FIG. 23 shows the distribution in a (001) silicon wafer. In FIGS. 22 and 23, the thick lines each represent the distribution of the value of Ey/Ex/Gxy, and the broken circles each represent the angles (10° per marking).

In the (110) silicon wafer, the value of Ey/Ex/Gxy in the plane of the wafer is maximized in the [001] direction and the [00-1] direction, as shown in FIG. 22. It is therefore found that setting the longitudinal direction of the substrate 10, which forms the piezoelectric drive apparatus, to be the <100> direction allows the longitudinal direction of the substrate 10 to coincide with the direction in which the value of Ey/Ex/Gxy is maximized in the plane of the substrate 10.

In the (001) silicon wafer, the value of Ey/Ex/Gxy in the plane of the wafer is maximized in the [100] direction, the [010] direction, the [-100] direction, and the [0-10] direction, as shown in FIG. 23. It is therefore found that setting the longitudinal direction of the substrate 10, which forms the piezoelectric drive apparatus, to be the <100> direction allows the longitudinal direction of the substrate 10 to coincide with the direction in which the value of Ey/Ex/Gxy is maximized in the plane of the substrate 10. Further, FIGS. 22 and 23 show that setting the longitudinal direction of the substrate 10 to fall within ±10° on both sides of the <100> direction allows the value of Ey/Ex/Gxy to be sufficiently large.

The simulation in the section "3.1." described above and FIGS. 22 and 23 show that in the case where the substrate 10 is a {110} substrate or a {100} substrate, setting the longitudinal direction of the substrate 10 to be the <100> direction, in which the value of Ey/Ex/Gxy is maximized in the plane of the substrate 10, allows increases in the bending displacement ratio and the ratio between the vertical displacement multiplied by the bending displacement.

4. Variation of Piezoelectric Drive Apparatus for Motor

Figure 24:
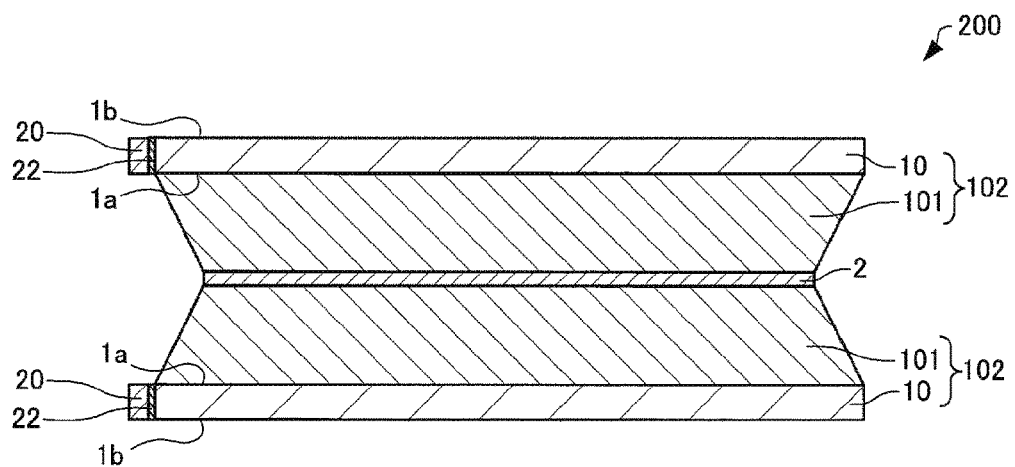
FIG. 24 is a cross-sectional view diagrammatically showing a piezoelectric drive apparatus for a motor according to a variation of the present embodiment.

A piezoelectric drive apparatus for a motor according to a variation of the present embodiment will next be described with reference to the drawings. FIG. 24 is a cross-sectional view diagrammatically showing a piezoelectric drive apparatus for a motor 200 according to the variation of the present embodiment.

In the following description, in the piezoelectric drive apparatus for a motor 200 according to the variation of the present embodiment, members having the same functions as the constituent members of the piezoelectric drive apparatus for a motor 100 according to the present embodiment have the same reference characters and will not be described in detail.

In the piezoelectric drive apparatus for a motor 100 described above, one chip 102 is provided, as shown in FIG. 2. In contrast, in the piezoelectric drive apparatus for a motor 200, a plurality of chips 102 are provided, as shown in FIG. 24. The plurality of chips 102 are arranged in the thickness direction of the substrate 10. In the example shown in FIG. 24, the piezoelectric drive apparatus for a motor 200 includes two chips 102, but the number of chips 102 is not limited to two. In FIG. 24, the fixing section 12 is omitted for convenience.

Each substrate 10 has a first surface 1a and a second surface 1b, which faces away from the first surface 1a. A structural body 101 is provided on the first surface 1a. The structural body 101 includes, for example, the piezoelectric element 30, an insulating layer (not shown) that covers the piezoelectric element, a first wiring layer (not shown) electrically connected to the first electrodes 32, and a second wiring layer (not shown) electrically connected to the second electrodes 36. The structural body 101 forms a chip 102.

In the example shown in FIG. 24, the first surface 1a of one of the chips 102 faces the first surface 1a of the other chip 102, and the structural body 101 of the one chip 102 is joined with the structural body 101 of the other chip 102 with an adhesive 2.

Although not shown, the first surface 1a of one of the chips 102 faces the second surface 1b of the other chip 102, and the structural body 101 of the one chip 102 is joined with the substrate 10 of the other chip 102 with the adhesive 2.

The piezoelectric drive apparatus for a motor 200 is manufactured by arranging the plurality of chips 102 in the thickness direction of the chip regions 10a (substrates 10), for example, after the step (S3) described above.

The piezoelectric drive apparatus for a motor 200, in which the plurality of chips 102 are arranged in the thickness direction of the substrates 10, can achieve higher output than, for example, in the case where only one chip 102 is provided.

5. Apparatus Using Piezoelectric Drive Apparatus for a Motor

The piezoelectric drive apparatus for a motor according to the embodiment of the invention, which uses resonance, can exert large force on a driven body and can be used with a variety of types of apparatus. The piezoelectric drive apparatus for a motor according to the embodiment of the invention can be used as a drive apparatus in a variety of types of instruments, for example, a robot (including electronic part transport apparatus (IC handler)), a pump for drug administration, a calendar forwarding apparatus of a timepiece, and a sheet feeding mechanism of a printing apparatus. Representative embodiments will be described below. An apparatus including the piezoelectric drive apparatus for a motor 100 as the piezoelectric drive apparatus for a motor according to the embodiment of the invention will be described below.

5.1. Robot

Figure 25:
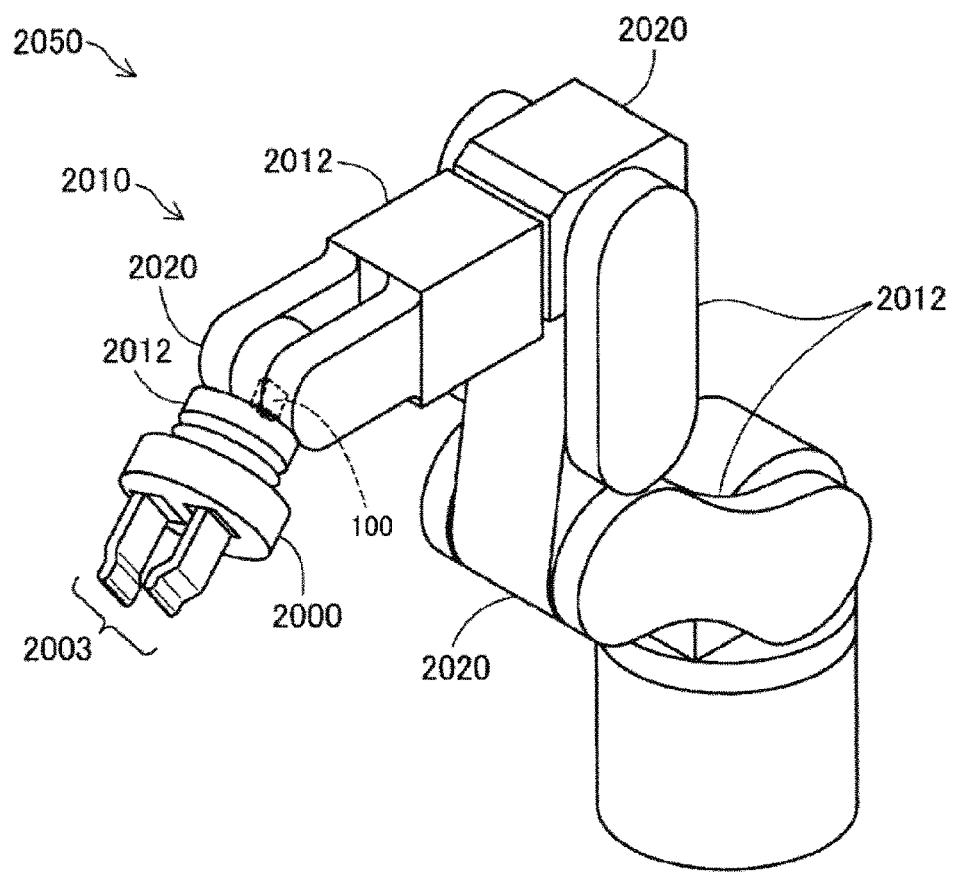
FIG. 25 describes a robot according to the present embodiment.

FIG. 25 describes a robot 2050 using the piezoelectric drive apparatus for a motor 100. The robot 2050 includes an arm 2010 (also referred to as "arm section") including a plurality of links 2012 (also referred to as "link members") and a plurality of joints 2020, which connect the links 2012 to each other in such a way that the links 2012 are pivotable or bendable.

The piezoelectric drive apparatus for a motor 100 is built in each of the joints 2020 and used to allow each of the joint 2020 to pivot or bend by an arbitrary angle. A robot hand 2000 is connected to the front end of the arm 2010. The robot hand 2000 has a pair of grippers 2003. The piezoelectric drive apparatus for a motor 100 is built also in the robot hand 2000 and used to open and close the grippers 2003 to allow them to grip an object. The piezoelectric drive apparatus for a motor 100 is provided also in the space between the robot hand 2000 and the arm 2010 and used to allow the robot hand 2000 to rotate relative to the arm 2010.

Figure 26:
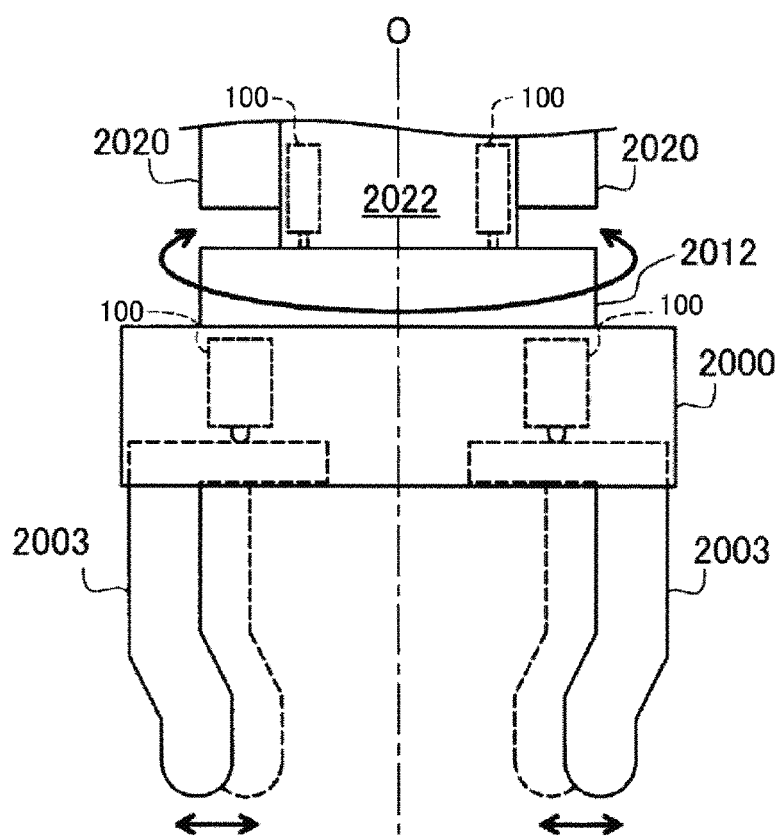
FIG. 26 describes a wrist portion of the robot according to the present embodiment.

FIG. 26 describes a wrist portion of the robot 2050 shown in FIG. 25. The joint 2020 at the wrist sandwiches a wrist pivot section 2022, and the link 2012 at the wrist is so attached to the wrist pivot section 2022 as to be pivotable around the center axis O of the wrist pivot section 2022. The wrist pivot section 2022 includes the piezoelectric drive apparatus for a motor 100, which causes the link 2012 at the wrist and the robot hand 2000 to pivot around the center axis O. The robot hand 2000 is provided with the plurality of grippers 2003 in such a way that they extend from the robot hand 2000. A base end portion of each of the grippers 2003 is movable in the robot hand 2000, and the piezoelectric drive apparatus for a motor 100 is incorporated in a root portion of each of the grippers 2003. Activating the piezoelectric drive apparatus for a motor 100 therefore allows the grippers 2003 to move and grip a target object. The robot is not limited to a single-arm robot, and the piezoelectric drive apparatus for a motor 100 can also be used with a multi-arm robot having two or more arms.

In each of the joint 2020 at the wrist and the robot hand 2000, not only is the piezoelectric drive apparatus for a motor 100 provided, but also electric power lines through which electric power is supplied to a variety of devices, such as a force sensor and a gyro sensor, signal lines through which signals are transmitted, and other components are provided, in other words, a significantly large number of wiring lines are required. It is therefore very difficult to incorporate such a large number of wiring lines in the joints 2020 and the robot hand 2000. However, since the piezoelectric drive apparatus for a motor 100 allows reduction in the drive current as compared with a typical electric motor, the wiring lines can be incorporated in small spaces, such as the joints 2020 (in particular, joint at front end of arm 2010) and the robot hand 2000.

5.2. Pump

Figure 27:
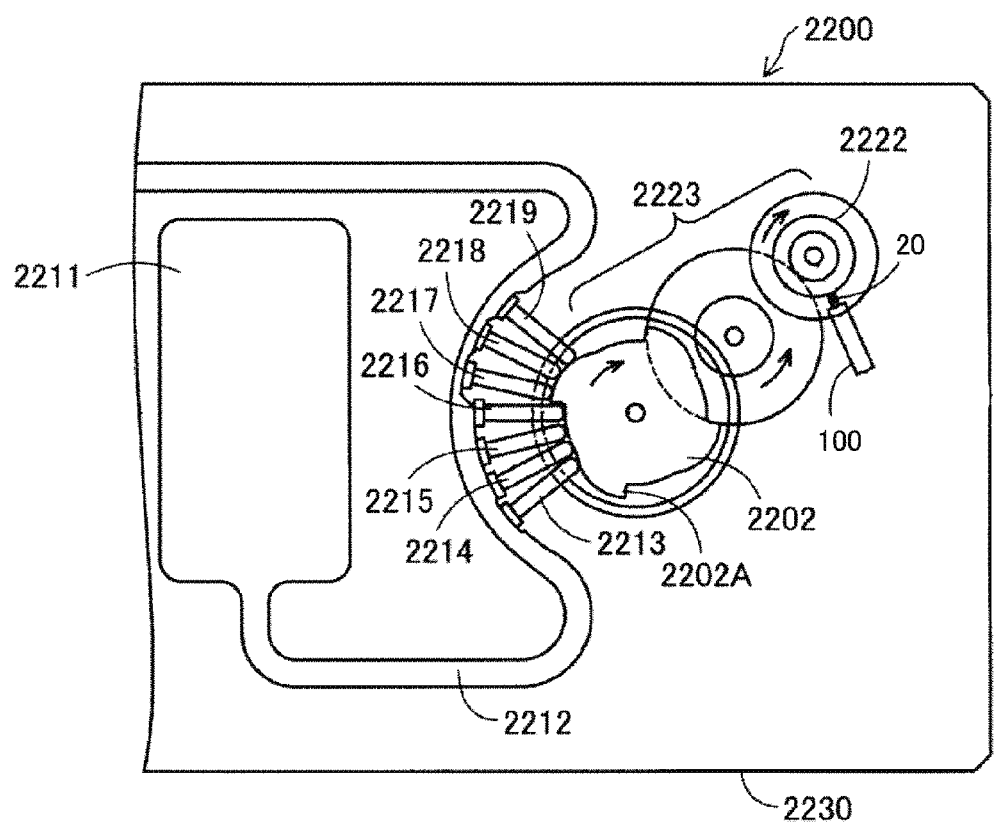
FIG. 27 describes a pump according to the present embodiment.

FIG. 27 describes an example of a liquid delivery pump 2200 using the piezoelectric drive apparatus for a motor 100. The liquid delivery pump 2200 includes a reservoir 2211, a tube 2212, the piezoelectric drive apparatus for a motor 100, a rotor 2222, a speed reduction/transmission mechanism 2223, a cam 2202, a plurality of fingers 2213, 2214, 2215, 2216, 2217, 2218, and 2219 in a case 2230.

The reservoir 2211 is a container for containing liquid to be transported. The tube 2212 is a tube through which the liquid delivered from the reservoir 2211 is transported. The contact section 20 of the piezoelectric drive apparatus for a motor 100 is so provided as to be pressed against the side surface of the rotor 2222, and the piezoelectric drive apparatus for a motor 100 drives and rotates the rotor 2222. The rotary force of the rotor 2222 is transmitted to the cam 2202 via the speed reduction/transmission mechanism 2223. The fingers 2213 to 2219 are members for blocking the tube 2212. When the cam 2202 rotates, a protrusion 2202A of the cam 2202 sequentially presses the fingers 2213 to 2219 outward in the radial direction. The fingers 2213 to 2219 block the tube 2212 sequentially from the upstream side in the transport direction (side facing reservoir 2211). As a result, the liquid in the tube 2212 is successively transported toward the downstream side. A very small amount of liquid can therefore be delivered with precision, and the size of the liquid delivery pump 2200 can also be reduced.

The arrangement of the members described above is not limited to that shown in FIG. 27. Further, the fingers or other members may not be provided, and a ball or any other component provided on the rotor 2222 may block the tube 2212. The liquid delivery pump 2200 described above can be used, for example, with a drug administration apparatus that administers a drug, such as insulin, into a human body. Further, use of the piezoelectric drive apparatus for a motor 100 allows reduction in the drive current as compared with a typical electric motor, whereby the electric power consumed by the drug administration apparatus can be suppressed. The piezoelectric drive apparatus for a motor 100 is therefore particularly effective in a case where the drug administration apparatus is driven with a battery.

In the invention, part of the configuration may be omitted and the embodiment and the variations may be combined with each other to the extent that the features and advantageous effects described in the present application are provided.

The invention encompasses substantially the same configuration as the configuration described in the embodiment (for example, a configuration having the same function, using the same method, and providing the same result or a configuration having the same purpose and providing the same effect). Further, the invention encompasses a configuration in which an inessential portion of the configuration described in the embodiment is replaced. Moreover, the invention encompasses a configuration that provides the same advantageous effect as that provided by the configuration described in the embodiment or a configuration that can achieve the same purpose as that achieved by the configuration described in the embodiment. Further, the invention encompasses a configuration in which a known technology is added to the configuration described in the embodiment.

The entire disclosure of Japanese Patent Application No. 2015-236648, filed Dec. 3, 2015 is expressly incorporated by reference herein.

What is claimed is:

1. A piezoelectric drive apparatus for a motor, the apparatus comprising:
  a substrate having a longitudinal direction and a widthwise direction perpendicular to the longitudinal direction;
  a piezoelectric element provided on the substrate and having a first electrode, a second electrode, and a piezoelectric body positioned between the first electrode and the second electrode; and
  a contact section that is attached to a front end section of the substrate in the longitudinal direction thereof or in contact with the front end section of the substrate in the longitudinal direction thereof and comes into contact with a driven body, wherein the longitudinal direction of the substrate coincides with a direction in which Young's modulus is minimized in a plane of the substrate,
the substrate is a silicon single crystal substrate,
the substrate is a {110} substrate, and
the longitudinal direction of the substrate coincides with a <100> direction.

2. The piezoelectric drive apparatus for a motor according to claim 1,
wherein the substrate and the piezoelectric element form a chip,
the chip is formed of a plurality of chips, and
the plurality of chips are arranged in a thickness direction of the substrate.

3. A motor comprising:
the piezoelectric drive apparatus for a motor according to claim 1; and
a rotor rotated by the piezoelectric drive apparatus for a motor.

4. A robot comprising:
a plurality of links;
joints that connect the plurality of links to each other; and
the piezoelectric drive apparatus for a motor according to claim 1 and causing the plurality of links to pivot at the joints.

5. A pump comprising:
the piezoelectric drive apparatus for a motor according to claim 1;
a tube through which liquid is transported; and
a plurality of fingers that block the tube when the piezoelectric drive apparatus for a motor is driven.

6. A piezoelectric drive apparatus for a motor, the apparatus comprising:
a substrate having a longitudinal direction and a widthwise direction perpendicular to the longitudinal direction;
a piezoelectric element provided on the substrate and having a first electrode, a second electrode, and a piezoelectric body positioned between the first electrode and the second electrode; and
a contact section that is attached to a front end section of the substrate in the longitudinal direction thereof or in contact with the front end section of the substrate in the longitudinal direction thereof and comes into contact with a driven body,
wherein the longitudinal direction of the substrate coincides with a direction in which a value of Ey/Ex/Gxy is maximized in a plane of the substrate, where Gxy represents a shear elastic coefficient of the substrate in the widthwise direction thereof, Ex represents Young's modulus of the substrate in the longitudinal direction thereof, and Ey represents Young's modulus of the substrate in the widthwise direction thereof.

7. A motor comprising:
the piezoelectric drive apparatus for a motor according to claim 6; and
a rotor rotated by the piezoelectric drive apparatus for a motor.

8. A robot comprising:
a plurality of links;
joints that connect the plurality of links to each other; and
the piezoelectric drive apparatus for a motor according to claim 6 and causing the plurality of links to pivot at the joints.

9. A pump comprising:
the piezoelectric drive apparatus for a motor according to claim 6;
a tube through which liquid is transported; and
a plurality of fingers that block the tube when the piezoelectric drive apparatus for a motor is driven.

* * * * *